(12) United States Patent
Lee

(10) Patent No.: US 11,791,369 B2
(45) Date of Patent: Oct. 17, 2023

(54) METHOD FOR ALIGNING A LIGHT-EMITTING ELEMENT, METHOD FOR FABRICATING A DISPLAY DEVICE USING THE SAME AND DISPLAY DEVICE

(71) Applicant: SAMSUNG DISPLAY CO., LTD., Yongin-si (KR)

(72) Inventor: Hyun Woo Lee, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 131 days.

(21) Appl. No.: 16/897,998

(22) Filed: Jun. 10, 2020

(65) Prior Publication Data

US 2021/0175279 A1  Jun. 10, 2021

(30) Foreign Application Priority Data

Dec. 6, 2019 (KR) .................. 10-2019-0161605

(51) Int. Cl.
*H01L 27/15* (2006.01)
*H01L 33/00* (2010.01)
*H01L 33/20* (2010.01)

(52) U.S. Cl.
CPC ........ *H01L 27/156* (2013.01); *H01L 33/0095* (2013.01); *H01L 33/20* (2013.01)

(58) Field of Classification Search
CPC ... H01L 27/156; H01L 33/0095; H01L 33/20; H01L 21/6835; H01L 2221/68309;
(Continued)

(56) References Cited

U.S. PATENT DOCUMENTS

2004/0248416 A1* 12/2004 Bock ................. H01L 25/50
  438/691
2005/0110161 A1*  5/2005 Naito ................. H01L 24/14
  257/E23.068
(Continued)

FOREIGN PATENT DOCUMENTS

EP  3557620 A1  10/2019
JP  2016-25205 A  2/2016
(Continued)

OTHER PUBLICATIONS

EPO Extended European Search Report dated Feb. 12, 2021, issued in corresponding European Patent Application No. 20193225.8 (9 pages).
(Continued)

*Primary Examiner* — Su C Kim
(74) *Attorney, Agent, or Firm* — Lewis Roca Rothgerber Christie LLP

(57) ABSTRACT

A method of aligning light-emitting elements, a method of fabricating a display device, and a display device are provided. The method of aligning light-emitting elements comprises providing a base substrate and a plurality of conductive patterns on the base substrate and spaced apart from one another, spraying ink in which a plurality of light-emitting elements are dispersed on the base substrate, positioning the plurality of light-emitting elements on the conductive pattern and orienting one end of each of the plurality of light-emitting elements in a first direction.

20 Claims, 22 Drawing Sheets

(58) Field of Classification Search
CPC . H01L 2221/68322; H01L 2221/68354; H01L 2224/48237; H01L 2224/49107; H01L 25/0753; H01L 33/62; H01L 24/89; H01L 23/49816; H01L 27/1214
See application file for complete search history.

(56) References Cited

U.S. PATENT DOCUMENTS

| | | |
|---|---|---|
| 2008/0218299 A1 | 9/2008 | Arnold |
| 2011/0309377 A1* | 12/2011 | Braune ............... H01L 25/0753 438/26 |
| 2015/0144982 A1* | 5/2015 | Chen .................... H01L 33/508 257/98 |
| 2015/0325748 A1* | 11/2015 | Ting ..................... H01L 33/486 257/98 |
| 2016/0148911 A1* | 5/2016 | Do ....................... H05K 1/0295 438/28 |
| 2017/0141279 A1 | 5/2017 | Do et al. |
| 2018/0122298 A1* | 5/2018 | Lee ....................... G09G 3/3233 |
| 2019/0214364 A1* | 7/2019 | Kreuter .................. H01L 24/96 |
| 2019/0326477 A1 | 10/2019 | Kim et al. |
| 2020/0091370 A1* | 3/2020 | Ting ....................... H01L 24/95 |

FOREIGN PATENT DOCUMENTS

| | | |
|---|---|---|
| KR | 10-1638274 B1 | 7/2016 |
| KR | 1020170107619 A | 9/2017 |

OTHER PUBLICATIONS

European Office action dated Jul. 4, 2022, in corresponding EP Application No. 20193225.8 (9 pages).

* cited by examiner

FIG. 1
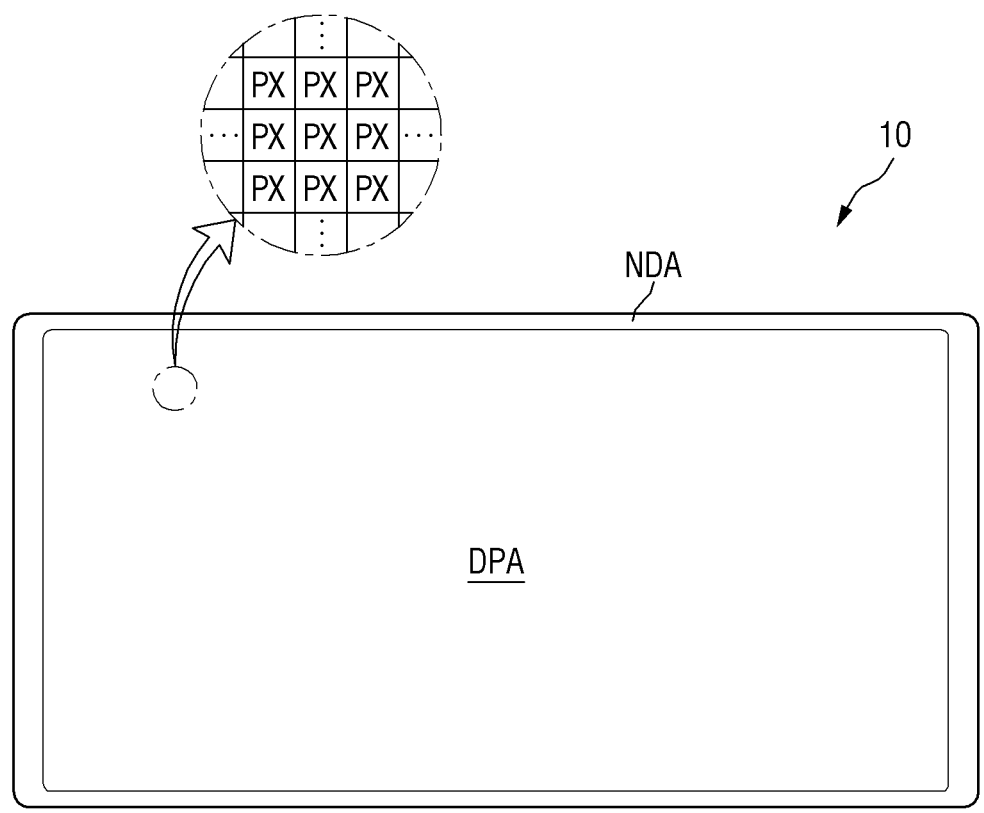
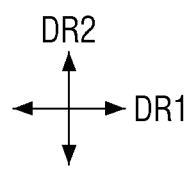

FIG. 7
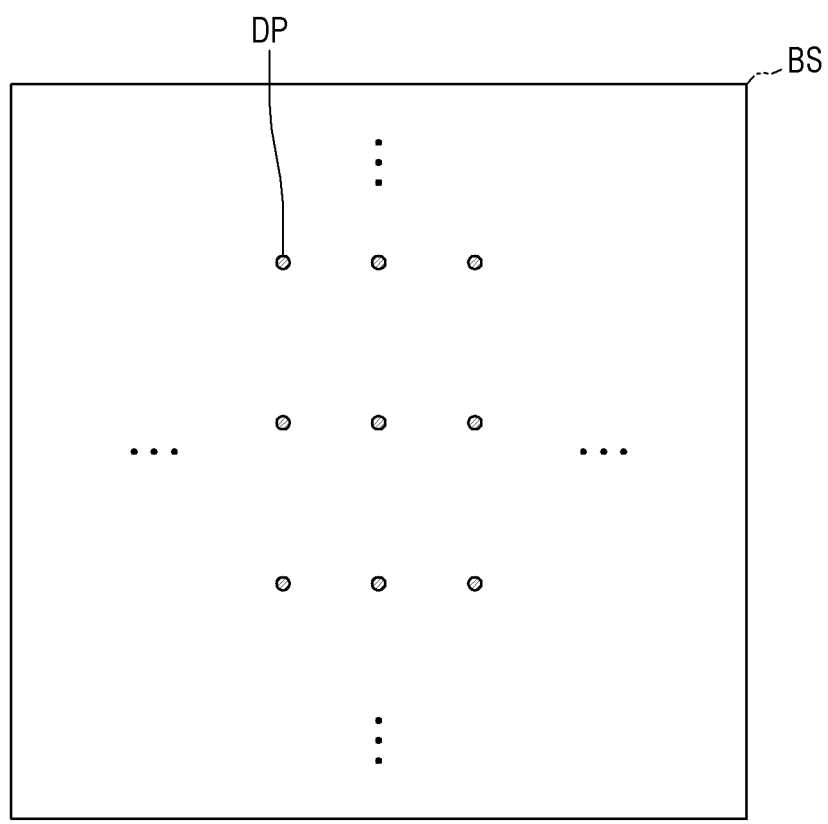
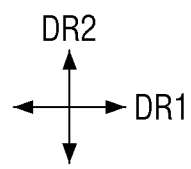

METHOD FOR ALIGNING A LIGHT-EMITTING ELEMENT, METHOD FOR FABRICATING A DISPLAY DEVICE USING THE SAME AND DISPLAY DEVICE

CROSS-REFERENCE TO RELATED APPLICATION

This application claims priority to and the benefit of Korean Patent Application No. 10-2019-0161605, filed on Dec. 6, 2019, in the Korean Intellectual Property Office, the entire content of which is incorporated herein by reference.

BACKGROUND

1. Field

Embodiments of the present disclosure relates to a method of aligning a light-emitting element, a method of fabricating a display device using the same, and a display device thereof, and, for example, to a light-emitting element aligning method in which a plurality of light-emitting elements are aligned on a substrate by using conductive patterns spaced apart from one another on the substrate, a display device fabrication method using the same, and a display device thereof.

2. Description of the Related Art

Along with the development of multimedia, display devices are increasing in importance and demand. In response to this increase, several kinds of display devices, such as a liquid crystal display (LCD) and/or an organic light-emitting display (OLED), have been used.

Display devices include display panels, such as an OLED panel or an LCD panel, as devices for displaying images. A light-emitting element may be included as a light-emitting display panel among the display panels. For example, a light-emitting diode (LED) may include an organic light-emitting diode (OLED) using an organic material as a fluorescent material, an inorganic light-emitting diode using an inorganic material as a fluorescent material, and/or the like.

SUMMARY

One or more aspects of embodiments of the present disclosure provide a light-emitting element alignment method that aligns light-emitting elements, which have a fine (e.g., micro) size, on a substrate in a certain (predetermined or set) orientation.

One or more aspects of embodiments of the present disclosure also provide a method of fabricating a display device including a plurality of light-emitting elements, by transferring the aligned light-emitting elements onto a target substrate. One or more aspects of embodiments of the present disclosure also provide the display device manufactured using the method of fabrication of the present embodiments.

It should be noted that objects and embodiments of the present disclosure are not limited to the above-described objects and embodiments, and other objects and embodiments of the present disclosure will be apparent to those skilled in the art from the following descriptions.

According to an example embodiment of the disclosure, a method of aligning light-emitting elements comprises providing a base substrate and a plurality of conductive patterns on the base substrate, the plurality of conductive patterns being spaced apart from one another, spraying ink in which a plurality of light-emitting elements are dispersed on the base substrate, and positioning the plurality of light-emitting elements on the plurality of conductive patterns, and orienting the plurality of light-emitting elements by orienting one end of each of the plurality of light-emitting elements in a first direction.

In an example embodiment, the positioning of the plurality of light-emitting elements may comprise applying a first alignment signal to the plurality of conductive patterns to generate a first electromagnetic field on the plurality of conductive patterns, and positioning at least a portion of the plurality of light-emitting elements on the plurality of conductive patterns.

In an example embodiment, the plurality of light-emitting elements each independently may include conductive balls to which an attractive force is to be applied by the first electromagnetic field, and the positioning of the plurality of light-emitting elements may comprise seating the conductive balls of the at least a portion of the plurality of light-emitting elements on the conductive patterns.

In an example embodiment, a first alignment electrode and a second alignment electrode may be further arranged on the base substrate, the first alignment electrode and the second alignment electrode being spaced apart from each other in the first direction, and the orienting of the plurality of light-emitting elements may comprise applying a second alignment signal to the first alignment electrode and the second alignment electrode to generate a second electromagnetic field on the base substrate, and to change the positions and/or orientations of the plurality of light-emitting elements.

In an example embodiment, the orienting of the plurality of light-emitting elements may comprise applying a third alignment signal to the plurality of conductive patterns to generate a third electromagnetic field stronger than the first electromagnetic field.

In an example embodiment, in the orienting of the light-emitting elements, one end of each of the plurality of light-emitting elements that are positioned on the plurality of conductive patterns may be oriented in the first direction, and at least a portion of the plurality of light-emitting elements that are not positioned on the plurality of conductive patterns may be placed on the plurality of conductive patterns and one end of each light-emitting element of the at least a portion of the plurality of light-emitting elements may be oriented in the first direction.

In an example embodiment, each light-emitting element of the plurality of light-emitting elements may have a long axis extending in one direction and may be oriented such that the long axis is in the first direction.

In an example embodiment, a diameter of each of the plurality of light-emitting elements may be larger than a diameter of each of the plurality of conductive patterns.

In an example embodiment, the plurality of conductive patterns may be spaced apart from each other in the first direction and in a second direction crossing the first direction, a first distance may be a distance between the plurality of conductive patterns spaced apart from one another in the first direction, and the first distance may be longer than a length of the long axis of each of the plurality of light-emitting elements.

In an example embodiment, a second distance may be a distance between the plurality of conductive patterns spaced apart from each other in the second direction, and the second distance may be shorter than the length of the long axis of each of the plurality of light-emitting elements and may be longer than the diameter of each of the plurality of light-emitting elements.

In an example embodiment, the plurality of light-emitting elements may comprise a first semiconductor layer, a second semiconductor layer, and an active layer therebetween, and the first semiconductor layer, the active layer, and the second semiconductor layer may be stacked in another direction perpendicular to the one direction in which the plurality of light-emitting elements extend.

In an example embodiment, the plurality of conductive patterns may include a plurality of first conductive patterns spaced apart from each other in the first direction and a plurality of second conductive patterns spaced apart from each other in the first direction, and wherein the plurality of second conductive patterns are spaced apart from the plurality of first conductive patterns in a third direction crossing the first direction.

In an example embodiment, the plurality of light-emitting elements may include a first light-emitting element and a second light-emitting element, and in the positioning of the plurality of light-emitting elements, a third electromagnetic field may be generated on the plurality of first conductive patterns, and the first light-emitting element may be positioned on the plurality of first conductive patterns, and a first electromagnetic field may be generated on the plurality of second conductive patterns, and the second light-emitting element may be positioned on the plurality of second conductive patterns.

According to an example embodiment of the disclosure, a method of fabricating a display device comprises providing a base substrate and a plurality of conductive patterns on the base substrate, the plurality of conductive patterns being spaced apart from each other, spraying ink in which a plurality of light-emitting elements are dispersed on the base substrate, each of the plurality of light-emitting elements having a shape extending in one direction, generating a first electromagnetic field on the plurality of conductive patterns, and positioning the plurality of light-emitting elements on the plurality of conductive patterns, generating a second electromagnetic field on the base substrate in a first direction and orienting the plurality of light-emitting elements, and transferring the plurality of light-emitting elements on a substrate.

In an example embodiment, the plurality of light-emitting elements may include conductive balls to which an attractive force is to be applied by the first electromagnetic field, and the positioning of the plurality of light-emitting elements may comprise seating the conductive balls on the plurality of conductive patterns.

In an example embodiment, the orienting of the plurality of light-emitting elements may comprise rotating the plurality of light-emitting elements by the second electromagnetic field such that one direction in which each of the plurality of light-emitting elements extends is substantially parallel to the first direction.

In an example embodiment, the plurality of light-emitting elements may be spaced apart from each other in the first direction and a second direction crossing the first direction, and a length of each of the plurality of light-emitting elements in the one direction may be longer than a distance in the second direction between adjacent ones of the plurality of the light-emitting elements.

In an example embodiment, a distance in the first direction between adjacent ones of the plurality of light-emitting elements may be shorter than a length of a long axis of each of the plurality of light-emitting elements.

According to an example embodiment of the disclosure, a display device comprises a first substrate, a semiconductor layer on the first substrate and including an active material layer of a drive transistor, a gate insulating layer on the semiconductor layer, a first gate conductive layer on the gate insulating layer and including a gate electrode of the drive transistor, a first interlayer insulating layer on the first gate conductive layer, a first data conductive layer on the first interlayer insulating layer and including a source/drain electrode of the drive transistor, a second interlayer insulating layer on the first data conductive layer, a second data conductive layer on the second interlayer insulating layer and including a first conductive line in contact with the source/drain electrode of the drive transistor, a first planarization layer on the second data conductive layer, a first electrode and a second electrode on the first planarization layer and spaced apart from each other, and a light-emitting element, both end portions of which are on the first electrode and second electrode, wherein the light-emitting element has a shape extending in one direction, includes a first electrode unit and a second electrode unit respectively at both ends of the light-emitting element in the one direction, and further includes a conductive ball on the first electrode unit and in direct contact with the first electrode.

In an example embodiment, the light-emitting element may include a first semiconductor layer, a second semiconductor layer, and an active layer therebetween, and the first semiconductor layer, the active layer, and the second semiconductor layer may be stacked in another direction perpendicular to the one direction.

BRIEF DESCRIPTION OF THE DRAWINGS

The above and other aspects and features of embodiments of the present disclosure will become more apparent by describing example embodiments thereof in more detail with reference to the attached drawings, in which:

FIG. 1 is a plan view of a display device according to an embodiment;

FIG. 7 is a plan view illustrating one operation of the method of aligning light-emitting elements according to an embodiment;

DETAILED DESCRIPTION

Embodiments of the present disclosure will now be described more fully hereinafter with reference to the accompanying drawings, in which certain embodiments of the disclosure are shown. The subject matter of this disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

It will also be understood that when a layer is referred to as being "on" another layer or substrate, it can be directly on the other layer or substrate (without any intervening layers therebetween), or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element, without departing from the teachings of the present disclosure. Similarly, the second element could also be termed the first element.

Hereinafter, embodiments will be described with reference to the accompanying drawings.

Figure 2:
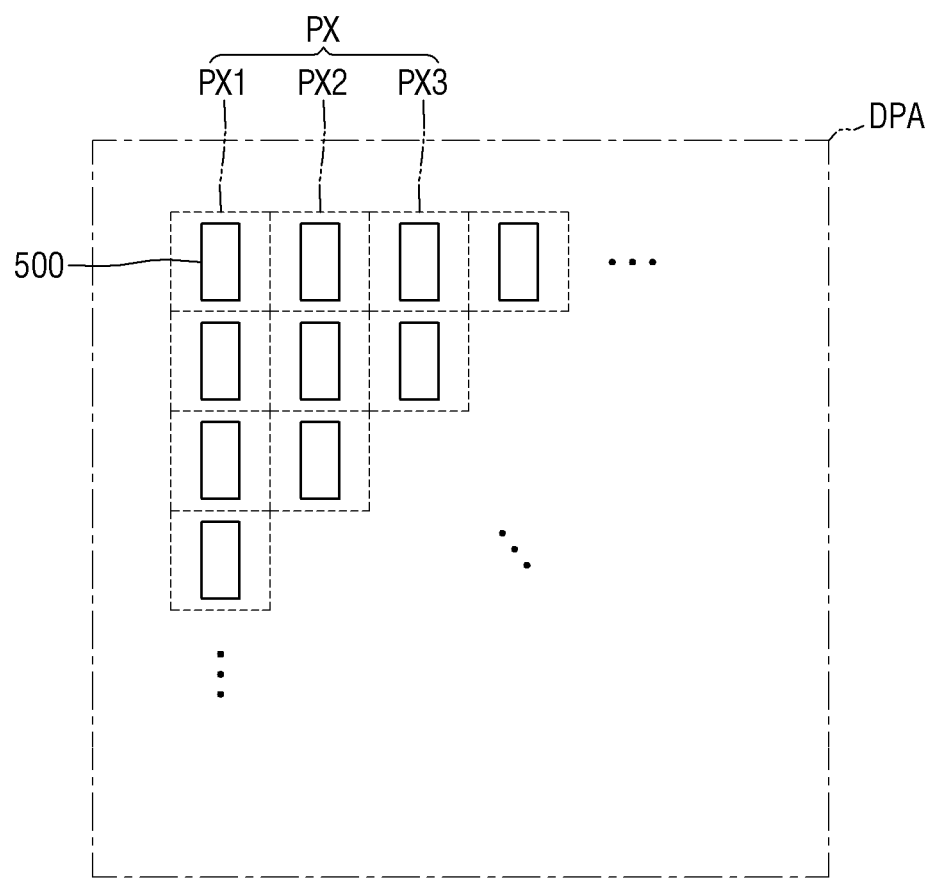
FIG. 2 is a schematic plan view illustrating pixels included in a display device according to an embodiment.

FIG. 1 is a schematic plan view of a display device according to an embodiment. FIG. 2 is a schematic plan view illustrating pixels included in a display device according to an embodiment.

Referring to FIGS. 1 and 2, a display device 10 can display a video or a still image. The display device 10 may refer to any suitable electronic device that is provided with a display screen. For example, the display device 10 may include a television, a notebook computer, a monitor, a billboard, an Internet of Things (IoT) device, a mobile phone, a smartphone, a tablet personal computer (PC), an electronic watch, a smartwatch, a watch phone, a head-mounted display, a mobile communication terminal, an electronic notebook, an e-book reader, a portable multimedia player (PMP), a navigation device, a game console, a digital camera, a camcorder, and/or the like, that are provided with a display screen.

The display device 10 may include a display panel that provides a display screen. Examples of the display panel may include an inorganic light-emitting diode display panel, an organic light-emitting display panel, a quantum dot light-emitting display panel, a plasma display panel, a field emission display panel, and/or the like. In the following description, an inorganic light-emitting diode display panel is utilized as an example of the display panel. However, the present disclosure is not limited thereto, and other suitable display panels may be utilized as long as substantially the same technical spirit is applicable.

The shape of the display device 10 is changeable in various suitable ways. For example, the display device 10 may have a shape of a horizontally long rectangle, a vertically long rectangle, a square, a quadrangle with rounded corners (vertices), other polygons, a circle, and/or the like. The shape of a display area DPA of the display device 10 may also be similar to the overall shape of the display device 10. In FIG. 1, the display device and the display area DPA are both illustrated in the shape of a horizontally long rectangle, but the present disclosure is not limited thereto.

The display device 10 may include a display area DPA and a non-display area NDA. The display area DPA is an area where a screen (e.g., an image) can be displayed, and the non-display area NDA is an area where no screen (e.g., image) is displayed. The display area DPA may be referred to as an active area, and the non-display area NDA may be referred to as an inactive area. The display area DPA may generally occupy the center of the display device 10 (e.g., may be substantially in the center of the display device 10).

The non-display area may be provided around the display area DPA. The non-display area NDA may completely or partially surround the display area DPA. The display area DPA may have a rectangular shape, and the non-display area NDA may be adjacent to the four sides of the display area DPA. The non-display area NDA may form the bezel of the display device 10. Lines and/or circuit driving units included in the display device 10 may be located in the non-display area NDA, and/or external devices may be mounted in the non-display area NDA.

The display area DPA may include a plurality of pixels PX. The plurality of pixels PX may be arranged in a matrix direction (e.g., in a matrix configuration). The shape of one or more of the pixels PX may be a rectangle or a square when viewed from the top. However, the present disclosure is not limited thereto, and the shape of one or more of the pixels PX may be a rhombus, with each side inclined in one direction. The pixels PX may be alternately arranged in a stripe type pattern or in a pentile type pattern.

Each of the pixels PX may include a plurality of sub-pixels PXn. For example, one pixel PX may include a first sub-pixel PX1, a second sub-pixel PX2, and a third sub-pixel PX3. Each of the sub-pixels PXn may include at least one light-emitting diode 500 to display a specific (or set) wavelength range of light. The light-emitting elements 500 in the sub-pixels PXn may contain different materials to emit different wavelength ranges of light. As an example, the light-emitting element 500 of the first sub-pixel PX1 may contain a material that emits (e.g., is configured to emit) a first light having a central wavelength range of a first wavelength, the light-emitting element 500 of the second sub-pixel PX2 may contain a material that emits (e.g., is configured to emit) a second light having a central wavelength range of a second wavelength, and the light-emitting element 500 of the third sub-pixel PX3 may contain a material that emits (e.g., is configured to emit) a third light having a central wavelength range of a third wavelength. Thus, the first sub-pixel PX1 may emit light of a first color, the second sub-pixel PX2 may emit light of a second color, and the third sub-pixel PX3 may emit light of a third color. In some embodiments, the light of the first color may be blue light having a central wavelength range of 450 nm to 495 nm, the light of the second color may be green light having a central wavelength range of 495 nm to 570 nm, and the light of the third color may be red light having a central wavelength range of 620 nm to 752 nm.

However, the present disclosure is not limited thereto. In some embodiments, the first sub-pixel PX1, the second sub-pixel PX2, and the third sub-pixel PX3 may include the same type (or kind) of light-emitting elements 500 to emit light of substantially the same color. Also, FIG. 2 illustrates that a pixel PX includes three sub-pixels PXn. However, the present disclosure is not limited thereto, and a pixel PX may include a larger number of sub-pixels PXn.

Each of the pixels PX of the display device 10 further includes a pixel driving circuit. The above-described lines may pass through, or adjacent to, the pixels PX, to apply a driving signal to the pixel driving circuits. Each of the pixel driving circuits may include a transistor and a capacitor. The numbers of transistors and capacitors of each pixel driving circuit may be variously changeable. An example pixel driving circuit will be described below using a 3T1C structure, where the term "3T1C" refers to the inclusion of three transistors and one capacitor. However, the present disclosure is not limited thereto, and various other suitably modified pixel PX structures, such as a 2T1C structure (two transistors and one capacitor), a 7T1C structure (seven transistors and one capacitor), and/or a 6T1C (six transistors and one capacitor) structure, may be utilized.

Figure 3:
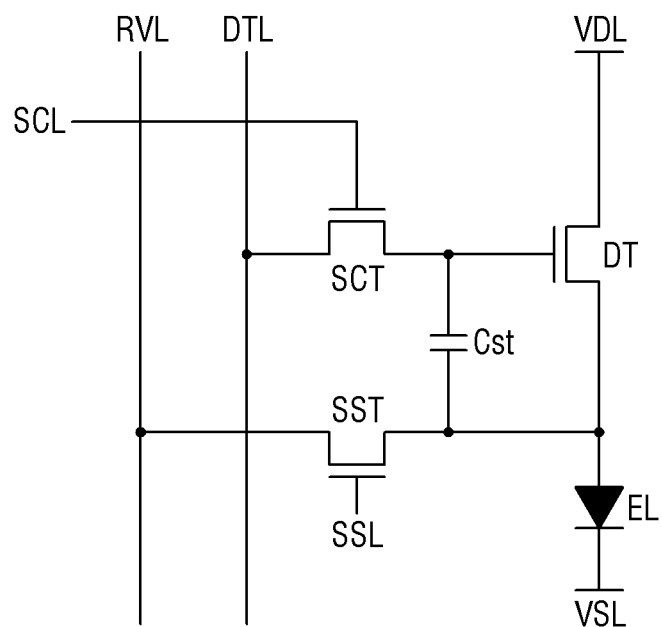
FIG. 3 is an equivalent circuit diagram of one pixel included in a display device according to an embodiment.

FIG. 3 is an equivalent circuit diagram of one pixel included in a display device according to an embodiment.

Referring to FIG. 3, each pixel PX of the display device according to an embodiment includes three transistors DT, SCT, and SST, and one storage capacitor Cst, in addition to a light-emitting diode EL.

The light-emitting diode EL emits light according to an electric current supplied through a drive transistor DT. The light-emitting diode EL includes a first electrode, a second electrode, and a light-emitting element 500 (see FIG. 4) interposed therebetween. The light-emitting element 500 may emit a specific (or set) wavelength range of light according to an electric signal delivered from the first electrode and the second electrode. This will be described in more detail below.

The light-emitting diode EL may have one end coupled to a first source/drain electrode of the drive transistor DT and the other end coupled to a first voltage line VSL through which a low-level voltage (a power voltage VSS), lower than a high-level voltage (a second power voltage VDD) of a second voltage line VDL, is supplied. As used herein, the expression "first source/drain electrode" refers to a first source electrode or a first drain electrode.

The drive transistor DT adjusts an electric current flowing from the second voltage line VDL, through which the first power voltage is supplied, to the light-emitting diode EL according to a difference in voltage between a gate electrode and a source electrode of the drive transistor DT. The drive transistor DT may have a gate electrode coupled to a first source/drain electrode of a scan transistor SCT, a first source/drain electrode coupled to the first electrode of the light-emitting diode EL, and a second source/drain electrode coupled to the second voltage line VDL to which the second power voltage VDD is applied.

The scan transistor SCT is turned on according to a scan signal of a scan line SCL, to couple a data line DTL to the gate electrode of the drive transistor DT. The scan transistor SCT may have a gate electrode coupled to the scan line SCL, a first source/drain electrode coupled to the gate electrode of the drive transistor DT, and a second source/drain electrode coupled to the data line DTL.

A sensing transistor SST may be turned on according to a sensing signal of a sensing line SSL, to couple a reference voltage line RVL to the first source/drain electrode of the drive transistor DT. The sensing transistor SST may have a gate electrode coupled to the sensing line SSL, a first source/drain electrode coupled to the reference voltage line RVL, and a second source/drain electrode coupled to the first source/drain electrode of the drive transistor DT.

In an embodiment, the first source/drain electrodes of the plurality of transistors DT, SCT, and SST may be, respectively, source electrodes, and the second source/drain electrodes of the plurality of transistors DT, SCT, and SST may be, respectively, drain electrodes. However, the present disclosure is not limited thereto, and the opposite is also a possible case.

The capacitor Cst is formed between the gate electrode and the first source/drain electrode of the drive transistor DT. The storage capacitor Cst stores a difference voltage between the gate voltage and the first source/drain voltage of the drive transistor DT.

Each of the plurality of transistors DT, SCT, and SST may be formed as a thin-film transistor. Also, in FIG. 3, the plurality of transistors DT, SCT, and SST will be described as being formed as an n-type metal oxide semiconductor field-effect transistor (MOSFET), but the present disclosure is not limited thereto. For example, the plurality of transistors DT, SCT, and SST may be formed as a p-type MOSFET. In some embodiments, some of the transistors DT, SCT, and SST may be formed as an n-type MOSFET, and the other of the transistors DT, SCT, and SST may be formed as a p-type MOSFET.

As described above, the display device 10 may include a plurality of pixels PX in the display area DPA, and each of the plurality of pixels PX may include a plurality of sub-pixels PXn arranged in one direction. For example, as shown in FIG. 2, the plurality of sub-pixels PXn may be arranged in the first direction DR1 and the second direction DR2. Likewise, light-emitting elements 500 on the sub-pixels PXn may be arranged in the display area DPA in one or more directions, to correspond to the sub-pixels PXn. The plurality of light-emitting elements 500 may be on the sub-pixels PXn and may be spaced apart from one another in the first direction DR1 and the second direction DR2. Such a display device 10 may be fabricated using a method of transferring light-emitting elements 500 aligned on another substrate (e.g., a base substrate or a transfer substrate), as opposed to a method of directly placing light-emitting elements 500 on a target substrate of the display device 10, but the present disclosure is not limited thereto.

Figure 4:
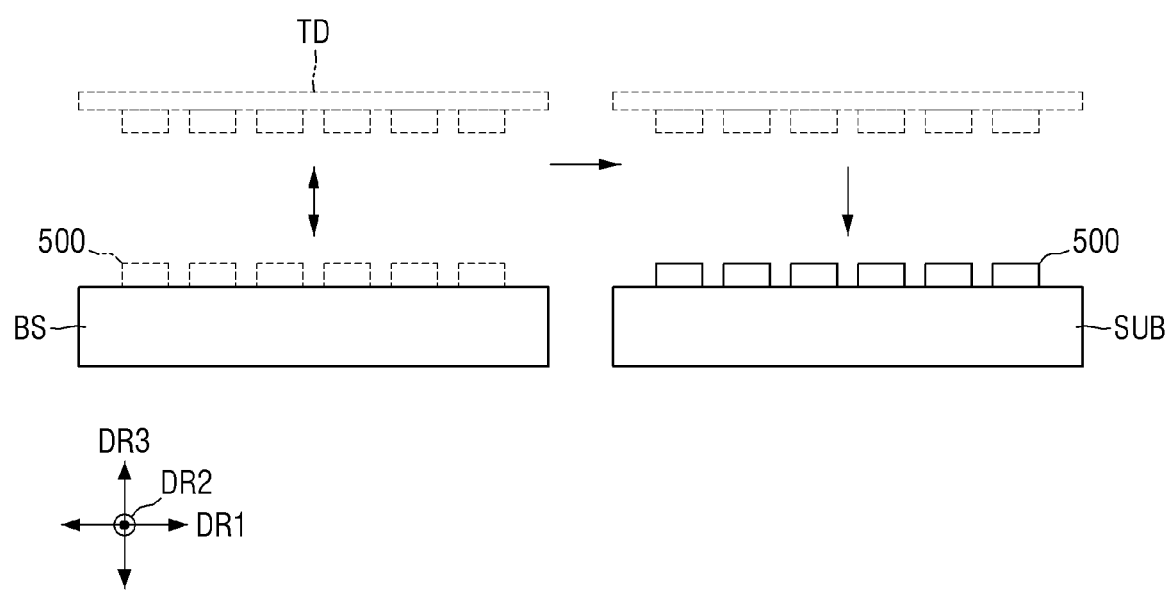
FIG. 4 is a schematic diagram illustrating a process of fabricating a display device according to an embodiment.

FIG. 4 is a schematic diagram illustrating a process of fabricating a display device according to an embodiment.

Referring to FIG. 4, a method of fabricating a display device 10 according to an embodiment may be performed in a process of transferring light-emitting elements 500 aligned on a base substrate BS onto a target substrate SUB. The light-emitting elements 500 may be aligned in one direction and provided on the base substrate BS. The light-emitting elements 500 aligned on the base substrate BS may then be transferred onto the target substrate SUB of the display device 10 using a transfer device TD. The transfer device TD may transfer the light-emitting elements 500 arranged on the base substrate BS onto the target substrate SUB through an operation of moving along the third direction DR3 and the first direction DR1. The target substrate SUB may be a substrate where areas corresponding to pixels PX or sub-pixels PXn of the display device 10 are defined, and the light-emitting elements 500 may be transferred to the areas of the target substrate SUB corresponding to the pixels PX or the sub-pixels PXn. Also, circuit elements for driving the pixels PX and/or the sub-pixels PXn may be further provided on the target substrate SUB.

Here, the light-emitting elements 500 may not be transferred by the transfer device TD individually. Instead, two or more of the light-emitting elements 500 positioned on the base substrate BS may be transferred onto the target substrate SUB in the same process (e.g., during the same act). In order for the light-emitting elements 500 to be accurately transferred to pixels PX or sub-pixels PXn defined on the target substrate SUB, the light-emitting elements 500 may be aligned on the base substrate BS to correspond to the pixels PX or the sub-pixels PXn of the display device 10.

Figure 5:
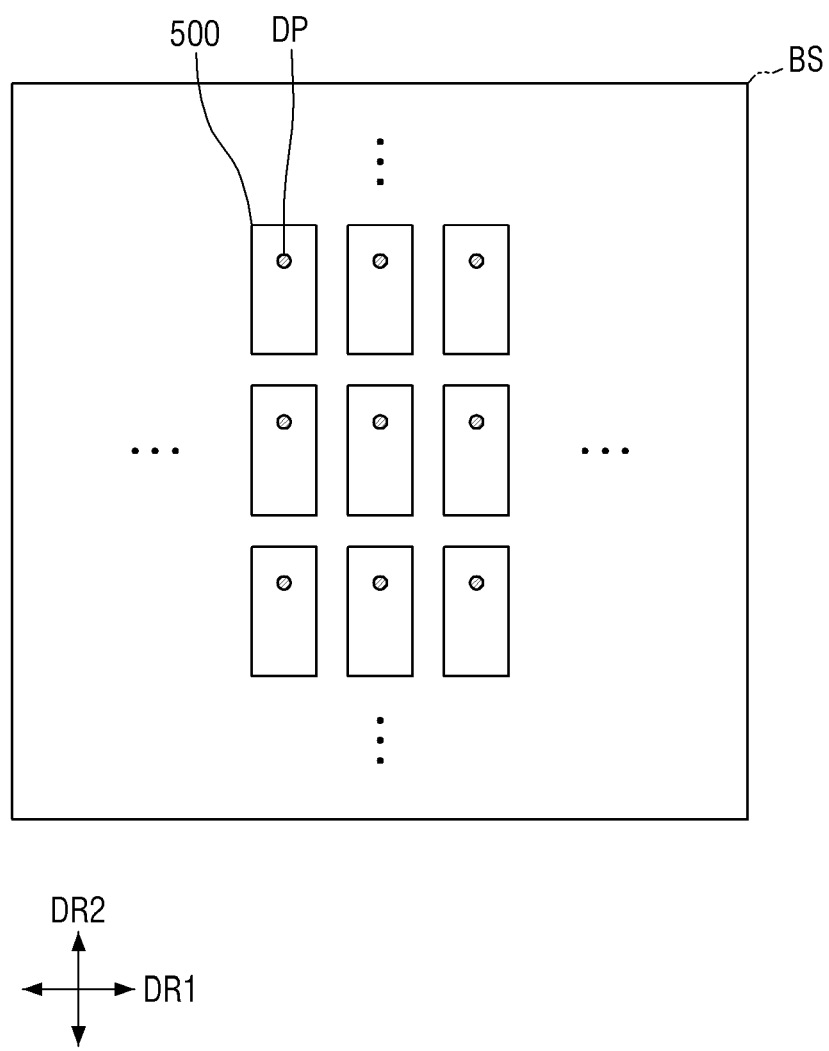
FIG. 5 is a plan view illustrating light-emitting elements aligned according to an embodiment.

FIG. 5 is a plan view illustrating the light-emitting elements aligned according to an embodiment. FIG. 5 schematically shows a plurality of light-emitting elements 500 arranged on the base substrate BS of FIG. 4.

Referring to FIG. 5, the light-emitting elements 500 may be arranged on the base substrate BS in at least one direction. The light-emitting elements 500 may be arranged in the first direction DR1 and the second direction DR2, and any light-emitting element 500 may be spaced apart from other adjacent light-emitting elements 500 in the first direction DR1 and the second direction DR2. In order for the light-emitting elements 500 to be arranged on the base substrate BS to correspond to sub-pixels PXn defined on the target substrate SUB, the plurality of light-emitting elements 500 may be aligned in the first direction DR1 and the second direction DR2 such that the light-emitting elements 500 are spaced apart from one another at uniform (e.g., substantially uniform) distances and/or are oriented in a uniform (e.g., substantially uniform) direction.

To this end, the method of aligning the light-emitting elements 500 according to an embodiment may include determining positions where the light-emitting elements 500 are to be placed and orienting the light-emitting elements 500 in one direction. The process of aligning the light-emitting elements 500 on the base substrate BS may include determining positions where the light-emitting elements 500 are to be placed, uniformly (e.g., substantially uniformly) arranging the light-emitting elements 500 apart from one another, and rotating and moving the light-emitting elements 500 on the basis of the initial arrangement, to orient the light-emitting elements 500 in a uniform (e.g., substantially uniform) direction.

For example, as shown in the drawings, a plurality of conductive patterns DP may be arranged on the base substrate BS, and the light-emitting elements 500 may have specific (or predetermined) portions to be placed on the conductive pattern DP. The method of aligning the light-emitting elements 500 according to an embodiment may include providing a base substrate on which the plurality of conductive patterns DP are spaced apart from one another, and placing the light-emitting elements 500 on the base substrate BS. The light-emitting elements 500 may have specific (or predetermined) portions placed on the conductive patterns DP, and thus the distances between the aligned light-emitting elements 500 may be uniform (e.g., substantially uniform).

Also, in some embodiments, each of the light-emitting elements 500 may have a shape extending in one direction, and the shape may have two axes with different lengths, for example, a long axis and a short axis. The plurality of light-emitting elements 500 may have an orientation in the direction of their long axes, and thus the plurality of light-emitting elements 500 on the base substrate BS may be aligned in a constant orientation (e.g., a same orientation). For example, the light-emitting elements 500 may be oriented such that the long axes point in the second direction DR2, while the specific portions the light-emitting elements 500 are placed on the conductive patterns DP. The method of aligning the light-emitting elements 500 according to an embodiment may include aligning the light-emitting elements 500 using the conductive pattern DP on the base substrate BS such that the light-emitting elements 500 are spaced apart from one another at regular (e.g., substantially) distances in a constant orientation (e.g., a same orientation). The light-emitting elements 500 transferred onto the target substrate SUB through a subsequent transfer process may be thus be arranged at accurate positions to correspond to the plurality of sub-pixels PXn.

The method of aligning the light-emitting elements 500 will be described below in more detail with further reference to other drawings herein.

Figure 6:
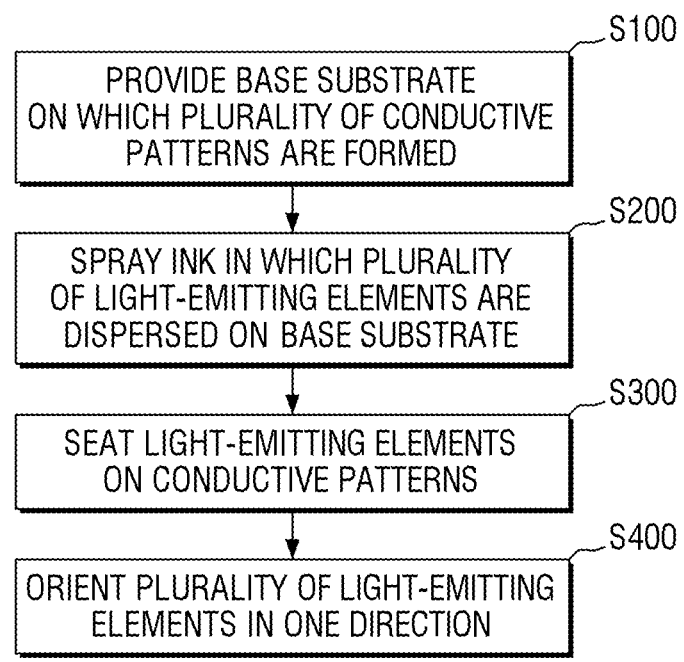
FIG. 6 is a flowchart illustrating a method of aligning light-emitting elements according to an embodiment.

FIG. 6 is a flowchart illustrating a method of aligning light-emitting elements according to an embodiment.

Referring to FIG. 6, a method of aligning light-emitting elements 500 according to an embodiment may include providing a base substrate BS on which a plurality of conductive patterns DP are formed (S100), spraying, onto the base substrate BS, ink in which a plurality of light-emitting elements 500 are dispersed (S200), seating the plurality of light-emitting elements 500 on the conductive patterns DP (S300), and orienting the light-emitting elements 500 in one direction (S400).

In an embodiment, the light-emitting elements 500 may be sprayed onto the base substrate BS using an ink-jet printing method. The light-emitting elements 500 may be provided in a fine (e.g., micro) size and dispersed in ink (see "Ink" in FIG. 8), and the ink may be sprayed onto the base substrate BS. The light-emitting elements 500 dispersed in the ink Ink may be aligned on the base substrate BS through an operation of determining positions where the light-emitting elements 500 are to be placed, such that the light-emitting elements 500 have set or specific portions placed on the conductive patterns DP, and an operation of orienting the light-emitting elements 500 in one direction. The seating of the light-emitting elements 500 on the conductive pattern DP (S300) is an operation of determining positions where the light-emitting elements 500 are to be arranged. Subsequently, the light-emitting elements 500 may be aligned through the orienting of the light-emitting elements 500 in one direction. The method of aligning the light-emitting elements 500 will be described in more detail with reference to other drawings.

As used herein, the term "operation" may refer to an act of the method of the present embodiments.

FIG. 7 is a plan view illustrating one operation of the method of aligning light-emitting elements according to an embodiment.

First, referring to FIG. 7, a base substrate BS and a plurality of conductive patterns DP on the base substrate BS are provided (S100). The base substrate BS may provide a space where the conductive patterns DP are to be arranged, so that the light-emitting elements 500 can be placed on the conductive patterns DP. The material of the base substrate BS is not particularly limited as long as it can provide a space where the light-emitting elements 500 are to be aligned. As an example, the base substrate BS may contain glass, quartz, and/or a polymer resin, or may be a ceramic substrate, a glass wafer, a silicon wafer, and/or the like.

In some embodiments, alignment electrodes ED1 and ED2 (see FIG. 13) and a plurality of lines capable of applying an electric signal may be further provided on the base substrate BS. The plurality of lines may be electrically coupled to the conductive patterns DP to apply an electric signal to the conductive patterns DP, and the alignment electrodes ED1 and ED2 may generate an electric field and/or a magnetic field on the base substrate BS. As will be described in more detail later, when an electric signal is applied to the conductive patterns DP, the light-emitting elements 500 may be moved, and thus partially placed on the conductive patterns DP. When an electric signal is applied to the alignment electrodes ED1 and ED2, the light-emitting elements 500 may be rotated or moved, and thus oriented in one direction.

The plurality of conductive patterns DP are arranged on the base substrate BS. The conductive patterns DP may be spaced apart from one another at regular (e.g., substantially regular) distances. For example, the conductive patterns DP may be spaced apart from one another in the first direction DR1 and the second direction DR2 to form a lattice pattern on the entirety of the base substrate BS. In this drawing, the conductive patterns are shown as being spaced apart from one another in the first direction DR1 and the second direction DR2, where the first direction DR1 and the second direction DR2 are crossing each other (e.g., are perpendicular to each other), but the present disclosure is not limited thereto. In some embodiments, the conductive patterns DP may be spaced apart from each other along a direction inclined with respect to the first direction DR1 and the second direction DR2. Also, FIG. 7 shows conductive patterns DP only in a partial area of the base substrate BS. However, the present disclosure is not limited thereto, and the conductive patterns DP may be arranged over the entirety of the base substrate BS. The size of and the distance between the conductive patterns DP will be described in more detail below.

The conductive patterns DP may contain a conductive material so that an electric signal can be applied to the conductive patterns DP. For example, the conductive patterns DP may contain metal and may be electrically coupled to a plurality of lines included in the base substrate BS. The plurality of conductive patterns DP may be simultaneously (or concurrently) coupled to lines to which the same electric signal is to be applied, but the present disclosure is not limited thereto. In some embodiments, some of the conductive patterns DP may be coupled to lines different from those of the other conductive patterns DP, and thus different electric signals may be applied to the conductive patterns DP.

In some embodiments, the positions of the conductive patterns DP on the base substrate BS may vary depending on the arrangement of the sub-pixels PXn of the display device 10 onto which the light-emitting elements 500 are to be transferred. The light-emitting elements 500 may be transferred on the target substrate SUB of the display device 10, and areas corresponding to the pixels PX or the sub-pixels PXn of the display device 10 may be defined on the target substrate SUB. The light-emitting elements 500 may be aligned on the base substrate BS so that the light-emitting elements 500 can be transferred to the corresponding areas defined on the target substrate SUB. To this end, the conductive patterns DP may also correspond to the areas defined on the target substrate SUB. For example, in the process of fabricating the display device 10 using the method of aligning the light-emitting elements 500, the positions of and the distance between the conductive patterns DP on the base substrate BS may vary depending on the arrangement of the pixels PX and/or the sub-pixels PXn of the display device 10. However, the present disclosure is not limited thereto.

Subsequently, ink, in which the plurality of light-emitting elements 500 are dispersed, is sprayed onto the base substrate BS (S200).

Figure 8:
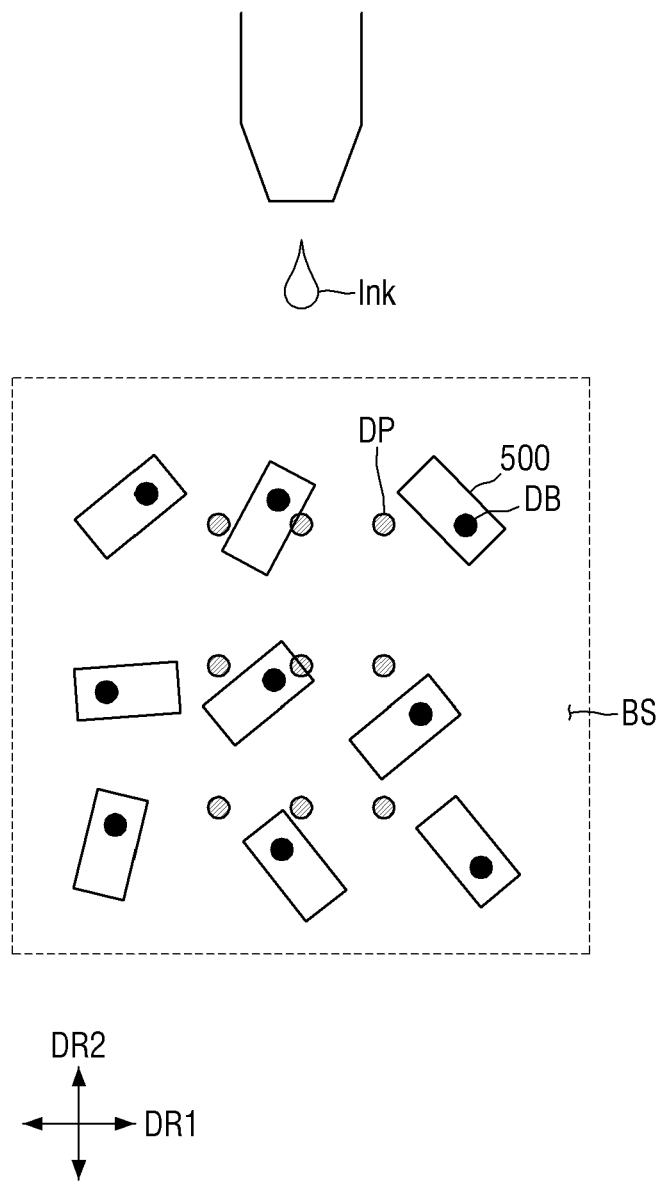
FIG. 8 shows schematic diagrams illustrating one operation of the method of aligning light-emitting elements according to an embodiment.

FIG. 8 shows schematic diagrams illustrating one operation of the method of aligning light-emitting elements according to an embodiment.

Referring to FIG. 8, the ink Ink, in which the plurality of light-emitting elements 500 are dispersed, is sprayed onto the base substrate BS. In an embodiment, the light-emitting elements 500 may be sprayed onto the base substrate BS through an ink-jet printing method. The light-emitting elements 500 may be randomly positioned such that the directions of the long axes of the light-emitting elements 500 are not uniform, and also the distances between the light-emitting elements 500 are not constant. Subsequently, the light-emitting elements 500 may be uniformly (e.g., substantially uniformly) aligned by varying (e.g., changing) their respective orientations and positions.

In some embodiments, the light-emitting elements 500 sprayed through an ink-jet printing method may be surface-treated, so that the light-emitting elements 500 do not aggregate with each other, or may be sonicated on the base substrate BS. When the light-emitting elements 500 are aggregated due to an attractive force applied therebetween, the plurality of light-emitting elements 500 may not be uniformly (e.g., substantially uniformly) aligned on the base substrate BS. To prevent or reduce the possibility of the light-emitting elements 500 aggregating, dispersion through surface treatment or a physical method such as sonication may be used. However, the present disclosure is not limited thereto.

In some embodiments, the light-emitting elements 500 may each independently be a light-emitting diode (LED) or an LED chip containing an inorganic semiconductor. In an example embodiment, a light-emitting element 500 may be a micro-LED chip with a shape extending in one direction and a size in micrometers or nanometers. When the light-emitting element 500 is an LED chip, the light-emitting element 500 may include a semiconductor layer doped with impurities of any conductive type (e.g., p-type or n-type), and may receive an electric signal applied from an external power source to emit light in a specific (or set) wavelength region.

Figure 9:
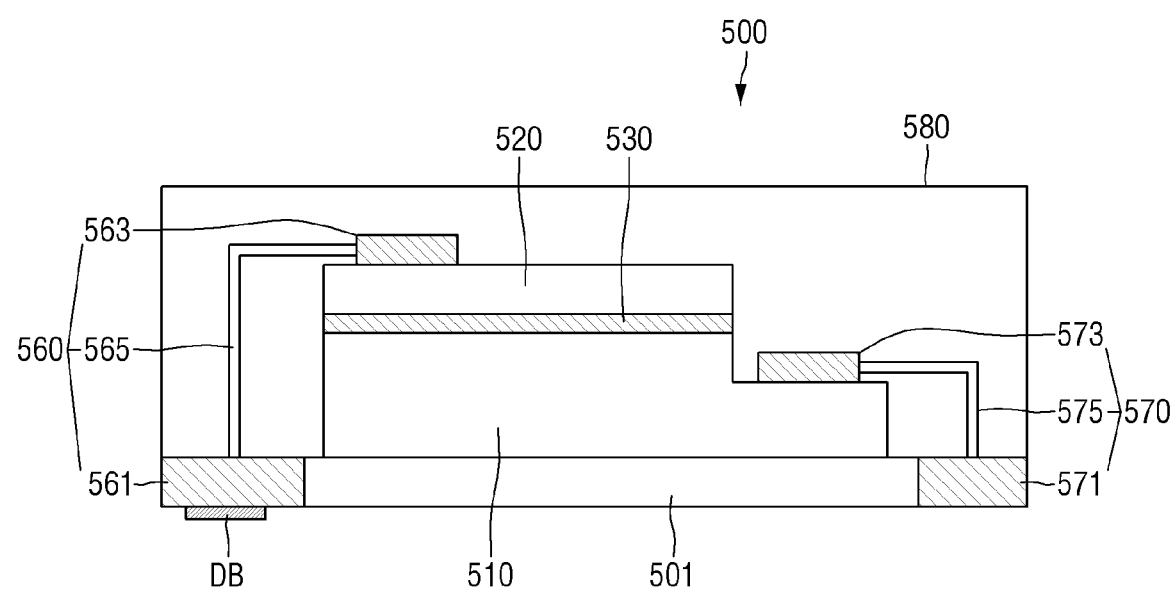
FIG. 9 is a schematic cross-sectional view of a light-emitting element according to an embodiment.

FIG. 9 is a schematic cross-sectional view of a light-emitting element according to an embodiment. FIG. 9 is a cross-sectional view schematically illustrating a light-emitting element 500 according to an embodiment.

Referring to FIG. 9 and to FIG. 8, the light-emitting element 500 may have a shape extending in one direction. The light-emitting element 500 may include a long axis corresponding to the extension direction and a short axis perpendicular to the long axis. As an example, the aspect ratio of the light-emitting element 500 may have a range of 1.2:1 to 100:1. The long axis of the light-emitting element 500 may have a length ranging from several micrometers to several hundred micrometers. For example, the length of the long axis of the light-emitting element 500 may range from 1 µm to 800 µm, or from 1 µm to 500 µm. In some embodiments, the length of the long axis of the light-emitting element 500 may range from 10 µm to 300 µm. However, the present disclosure is not limited thereto.

The light-emitting element 500 may have a structure in which a plurality of inorganic semiconductor layers are stacked. In an embodiment, in the light-emitting element 500, a direction in which the plurality of inorganic semiconductor layers are stacked and a direction in which the long axis of the light-emitting element 500 extends may be perpendicular (e.g., substantially perpendicular) to each other. For example, when the light-emitting element 500 has a shape extending in one direction, the inorganic semiconductor layers may be stacked in a direction perpendicular (e.g., substantially perpendicular) to the one direction. The plurality of semiconductor layers may have a shape extending in the direction of the long axis of the light-emitting element 500, and may be stacked in a thickness direction of the light-emitting element 500, perpendicular (e.g., substantially perpendicular) to the extension direction.

In some embodiments, the light-emitting element 500 may include a lower substrate 501, a first semiconductor layer 510, a second semiconductor layer 520, an active layer 530, a first electrode unit 560, a second electrode unit 570, and an external cap 580. In some embodiments, the light-emitting element 500 according to an embodiment may include a conductive ball DB on any one of the first electrode unit 560 or the second electrode unit 570.

The lower substrate 501 may be a growth substrate for growing the first semiconductor layer 510. As an example, the lower substrate 501 may include a transparent substrate such as a sapphire ($Al_2O_3$) and/or glass. However, the present disclosure is not limited thereto. In some embodiments, the lower substrate 501 may include a conductive substrate such as GaN, SiC, ZnO, Si, GaP, and/or GaAs.

The first semiconductor layer 510 may contain an n-type semiconductor. As an example, when the light-emitting element 500 emits light of a blue wavelength range, the first semiconductor layer 510 may contain a semiconductor material having a chemical formula of $Al_xGa_yIn_{1-x-y}N$ ($0 \leq x \leq 1$, $0 \leq y \leq 1$, $0 \leq x+y \leq 1$). For example, the first semiconductor layer 510 may contain one or more of AlGaInN, GaN, AlGaN, InGaN, AlN, and/or InN, each independently doped with n-type dopants. The first semiconductor layer 510 may be doped with n-type dopants. As an example, the n-type dopants may include Si, Ge, Sn, and/or the like. In an example embodiment, the first semiconductor layer 510 may contain n-type Si-doped n-GaN.

The second semiconductor layer 520 may be provided on the active layer 530, which will be described in more detail below. The second semiconductor layer 520 may contain a p-type semiconductor. As an example, when the light-emitting element 500 emits light of a blue or green wavelength range, the second semiconductor layer 520 may contain a semiconductor material having a chemical formula of $Al_xGa_yIn_{1-x-y}N$ ($0 \leq x \leq 1$, $0 \leq y \leq 1$, $0 \leq x+y \leq 1$). For example, the second semiconductor layer 520 may contain one or more of AlGaInN, GaN, AlGaN, InGaN, AlN, and/or InN, each independently doped with p-type dopants. When the second semiconductor layer 520 is doped with p-type dopants, the p-type dopants may be, for example, Mg, Zn, Ca, Se, Ba, and/or the like. In an example embodiment, the second semiconductor layer 520 may contain p-type Mg-doped p-GaN.

In FIG. 9, the first semiconductor layer 510 and the second semiconductor layer 520 are shown as being formed as a single layer, but the present disclosure is not limited thereto. In some embodiments, the first semiconductor layer 510 and the second semiconductor layer 520 may include more than one layer, for example, a clad layer (e.g., a cladding layer) and/or a tensile strain barrier reducing (TSBR) layer. This will be described in more detail below with reference to other drawings herein.

The active layer 530 may be provided between the first semiconductor layer 510 and the second semiconductor layer 520. The active layer 530 may be arranged on only a partial area of the first semiconductor layer 510, and a contact layer 573 of the second electrode unit 570 may be provided on an area of the first semiconductor layer 510 where the active layer 530 is not arranged. The active layer 530 may contain a material having a single or multiple quantum well structure. When the active layer 530 contains a material having the multiple quantum well structure, the active layer 530 may have a structure in which a plurality of quantum layers and a plurality of well layers are alternately stacked with each other. The active layer 530 may emit light through electron-hole pair recombination according to an electric signal applied through the first semiconductor layer 510 and the second semiconductor layer 520. As an example, when the active layer 530 emits light of a blue wavelength range, the active layer 530 may contain a material such as AlGaN, AlGaInN, and/or the like. For example, when the active layer 530 has a multiple quantum well structure, e.g., a structure in which a quantum layer and a well layer are alternately stacked, the quantum layer may contain a material such as AlGaN and/or AlGaInN, and the well layer may contain a material such as GaN and/or AlInN. In an example embodiment, the active layer 530 may contain AlGaInN as the quantum layer, and also contain AlInN as the well layer. As described above, the active layer 530 may emit blue light having a central wavelength range of 450 nm to 495 nm.

However, the present disclosure is not limited thereto, and the active layer 530 may have a structure in which a semiconductor material having a large band gap energy and a semiconductor material having a small band gap energy are alternately stacked with each other, and may contain different Group III-V semiconductor materials, depending on the wavelength range of the light to be emitted. Also, the light emitted by the active layer 530 is not limited to the light of the blue wavelength range. In some embodiments, the active layer 530 may emit light of a red or green wavelength region.

The light-emitting element 500 has a shape extending in one direction, and includes the first electrode unit 560 and the second electrode unit 570 respectively positioned at both ends of the extension direction of the light-emitting element 500. The first electrode unit 560 and the second electrode unit 570 may respectively include electrode layers 561 and 571 on the lower substrate 501, contact layers 563 and 573 on the first semiconductor layer 510 or the second semiconductor layer 520, and bridges 565 and 575 configured to electrically couple the electrode layers 561 and 571 to the contact layers 563 and 573, respectively. The first electrode unit 560 may include a first electrode layer 561, a first contact layer 563 on the second semiconductor layer 520, and a first bridge 565 configured to couple the first electrode layer 561 and the first contact layer 563; and the second electrode unit 570 may include a second electrode layer 571, a second contact layer 573 on the first semiconductor layer 510, and a second bridge 575 configured to couple the second electrode layer 571 to the second contact layer 573.

The first electrode layer 561 and the second electrode layer 571 may be on the lower substrate 501. In FIG. 9, the first electrode layer 561 and the second electrode layer 571 are shown as being at both sides (e.g., at both ends) of the lower substrate 501, but the present disclosure is not limited thereto. The first electrode layer 561 and the second electrode layer 571 are terminals of the light-emitting element 500 and may be electrically coupled to the electrodes on the sub-pixels PXn of the display device 10. While the display device 10 is being driven, the first electrode layer 561 and the second electrode layer 571 may deliver an electric signal applied from the electrodes to the contact layers 563 and 573 through the bridges 565 and 575. The first electrode layer 561 and the second electrode layer 571 may each independently contain a single-layer metal or a multilayer metal. As an example, the first electrode layer 561 and the second electrode layer 571 may contain one or more metals such as Al, Ti, Cr, Ni, and/or Au, one or more alloys thereof, and/or the like.

The first contact layer 563 may be on the second semiconductor layer 520, and the second contact layer 573 may be in an exposed area of the first semiconductor layer 510 where the active layer 530 is not present. The first contact layer 563 and the second contact layer 573 may deliver the electric signal applied through the bridges 565 and 575, respectively, to the first semiconductor layer 510 and the second semiconductor layer 520. As an example, the first contact layer 563 and the second contact layer 573 may contain one or more metals such as Al, Ti, Cr, Ni, and/or Au, one or more alloys thereof, and/or the like.

The first bridge 565 may electrically couple the first electrode layer 561 and the first contact layer 563, and the second bridge 575 may electrically couple the second electrode layer 571 and the second contact layer 573. The first bridge 565 and the second bridge 575 may each independently contain one or more metals such as Al, Ti, Cr, Ni, and/or Au, one or more alloys thereof, and/or the like. However, the present disclosure is not limited thereto. In some embodiments, the bridges 565 and 575 may be omitted from the first electrode unit 560 and the second electrode unit 570, respectively.

The light-emitting element 500 may further include an insulating film that surrounds a plurality of semiconductor layers. However, the present disclosure is not limited thereto, and the insulating film may be omitted.

The external cap 580 may be on the lower substrate 501 to protect the plurality of semiconductor layers. The external cap 580 may contain a transparent material so that the light generated in the active layer 530 can be emitted. For example, the external cap 580 may contain glass, quartz, a transparent polymer resin, and/or the like. However, the present disclosure is not limited thereto.

In some embodiments, the light-emitting element 500 may include an area surrounded by the external cap 580, and an area formed between the semiconductor layers and the external cap 580 may be further filled with other materials. For example, materials for changing the characteristics of light emitted from the active layer 530 may be further provided in the area surrounded by the external cap 580. In some embodiments, the light-emitting element 500 may contain phosphors or quantum dots in the area, to convert the light emitted from the active layer 530 into a different color light. In some cases, the light-emitting element 500 may include scatterers in the area.

The light-emitting element 500 according to an embodiment may include a conductive ball DB on any one of the first electrode layer 561 or the second electrode layer 571. In the light-emitting element 500 included in the display device 10, the first electrode unit 560, or the second electrode unit 570, and the conductive ball DB may be brought in contact with the electrodes of the display device 10. When the conductive ball DB is on the first electrode layer 561 of the first electrode unit 560, the second electrode layer 571 of the second electrode unit 570 and the conductive ball DB in the light-emitting element 500 may be brought into direct contact (e.g., physical contact) with the electrodes of the display device 10. The conductive ball DB may contain a conductive material, and the electric signal applied from the electrodes of the display device 10 may be delivered to the electrode units 560 and 570 of the light-emitting element 500, for example, to the first electrode layer 561 or the second electrode layer 571. As an example, the conductive ball DB of the light-emitting element 500 may contain one or more metals such as Al, Ti, Cr, Ni, and/or Au, one or more alloys thereof, and/or the like. However, the present disclosure is not limited thereto.

According to an embodiment, in the method of aligning the light-emitting elements 500, when the electric signal is applied to the conductive patterns DP of the base substrate BS, an electric field or a magnetic field may be formed on the conductive patterns DP, and the conductive ball DB of the light-emitting element 500 may receive an attractive force due to the electric field or the magnetic field. As shown in FIG. 8, the light-emitting elements 500 dispersed in the ink Ink may be initially positioned on the base substrate BS with no particular orientation. The light-emitting elements 500, each of which has a shape extending in one direction, may be initially positioned such that the directions of the long axes are not constant and the light-emitting elements 500 do not correspond to the conductive patterns DP of the base substrate BS. When an electric signal is applied to the conductive patterns DP in order to align the light-emitting elements 500, an electric field or a magnetic field generated by the electric signal may apply an attractive force to conductive balls DB of the light-emitting elements 500. When the attractive force is applied to the conductive balls DB while the light-emitting elements 500 are dispersed in the ink Ink, some of the light-emitting elements 500 may be placed on the conductive patterns DP. This will be described in more detail with further reference to other drawings.

Figure 10:
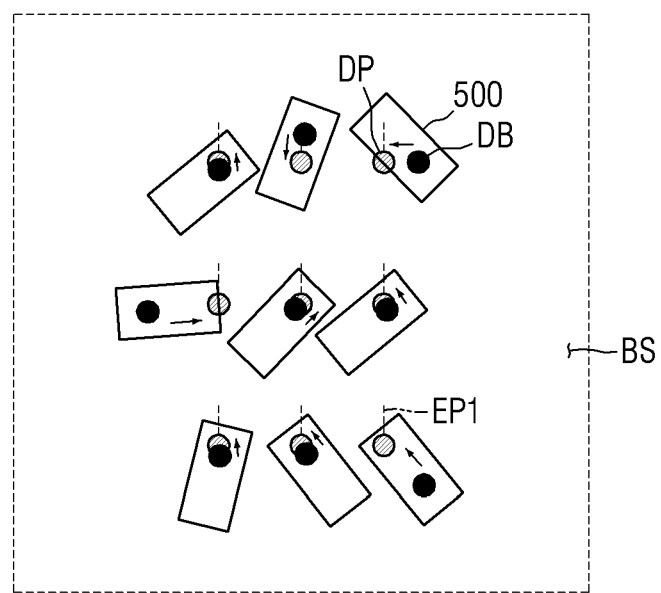
FIGS. 10-12 are schematic diagrams illustrating aspects of one operation of the method of aligning light-emitting elements according to an embodiment.
Figure 11:
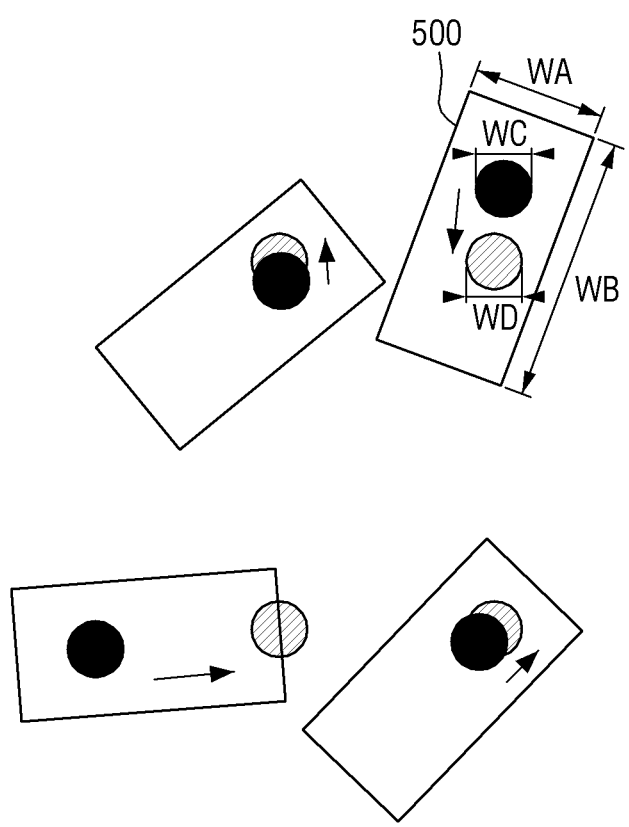
Figure 12:
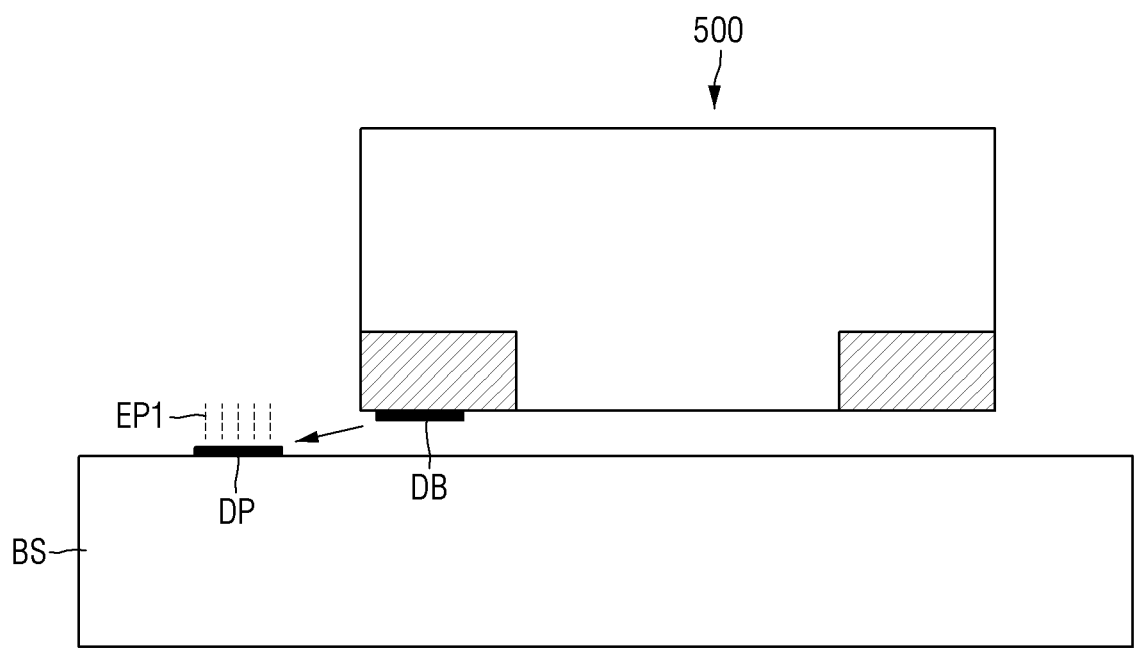

FIGS. 10 to 12 are schematic diagrams illustrating one operation of the method of aligning light-emitting elements according to an embodiment.

Referring to FIGS. 10 to 12, when the ink Ink in which the light-emitting elements 500 are dispersed is sprayed onto the base substrate BS, the light-emitting elements 500 are seated on the conductive patterns DP (S300). According to an embodiment, the seating of the light-emitting elements 500 on the conductive pattern DP may include positioning at least some of the plurality of light-emitting elements 500 on the conductive patterns DP. As an example, the seating of the light-emitting elements 500 on the conductive patterns DP may include applying a first alignment signal to the conductive patterns DP to form a first electromagnetic field EP1 on the conductive patterns DP, and then applying an attractive force to the conductive balls DB of the light-emitting elements 500.

In some embodiments, when the ink Ink is sprayed onto the base substrate BS, the light-emitting elements 500 may be randomly positioned with no particular orientation. When the first alignment signal is applied to the conductive patterns DP of the base substrate BS, the first electromagnetic field EP1 may be generated on the conductive patterns DP containing a conductive material (e.g., an electrically conductive material). The first electromagnetic field EP1 may be an electric field and/or a magnetic field generated due to the first alignment signal, but the present disclosure is not limited thereto.

The first electromagnetic field EP1 generated on the conductive patterns DP may apply an attractive force to the conductive balls DB of the light-emitting elements 500 dispersed in the ink Ink. The conductive balls DB may contain a conductive material (e.g., an electrically conductive material) to receive the attractive force by the first electromagnetic field EP1 generated due to the first alignment signal, and the light-emitting elements 500 that are fluidly dispersed in the ink Ink may have positions varying depending on the attractive force (e.g., may change positions depending on the attractive force). At least some of the plurality of light-emitting elements 500 may be positioned on the conductive patterns DP. In some embodiments, some of the light-emitting elements 500 may have conductive balls DB seated on the conductive patterns DP. Because the attractive force due to the first electromagnetic field EP1 is weakened and applied to other light-emitting elements 500, for example, light-emitting elements 500 spaced apart from the conductive patterns DP, conductive balls DB thereof may not be seated on the conductive patterns DP. Some of the light-emitting elements 500 may be moved such that they can be positioned in spaces between the conductive patterns DP, or such that a partial area of each of them can be positioned on the conductive patterns DP.

Here, when the conductive patterns DP have a diameter that is too large, a plurality of light-emitting elements 500 may be seated on one conductive pattern DP at the same time. According to an embodiment, a diameter WD (see FIG. 11) of the conductive pattern DP of the base substrate BS may be smaller than a length WB of the long axis of the light-emitting element 500 and a diameter (or width) WA of the short axis of the light-emitting element 500. By forming the diameter WD of the conductive pattern DP to be smaller than the diameter (or width) WA of the short axis of the light-emitting element 500, a plurality of light-emitting elements 500 may be prevented (or substantially prevented) from being seated on the same one conductive pattern DP.

According to some embodiments, the diameter WD of the conductive pattern DP may be greater than a diameter WC (see FIG. 11) of the conductive ball DB of the light-emitting element 500, so that the light-emitting elements 500 can be easily seated on the conductive patterns DP. When the conductive pattern DP is too small, the first electromagnetic field EP1 generated due to the applied first alignment signal may have weak strength (e.g., may be weak), and the movement of the light-emitting elements 500 may not be sufficient (or suitable). Thus, the diameter WD of the conductive pattern DP may be greater than the diameter WC of the conductive ball DB of the light-emitting element 500. However, the present disclosure is not limited thereto.

When the first electromagnetic field EP1 is generated on the conductive patterns DP, an attractive force may be applied to the conductive balls DB of the light-emitting elements 500 dispersed in the ink Ink, and the light-emitting elements 500 may vary (e.g., change) in position on the base substrate BS. However, as described above, not all of the light-emitting elements 500 in the ink Ink may be seated on the conductive patterns SP. Some of the light-emitting elements 500 may be positioned in spaces between the conductive patterns DP, or may be positioned such that the conductive balls DB of the light-emitting elements 500 are not seated on the conductive patterns DP. According to an embodiment, by adjusting the distance between the conductive patterns DP, when the light-emitting elements 500 are aligned in a subsequent process, light-emitting elements 500 that are not positioned on the conductive patterns DP may vary (e.g., change) in position.

Figure 13:
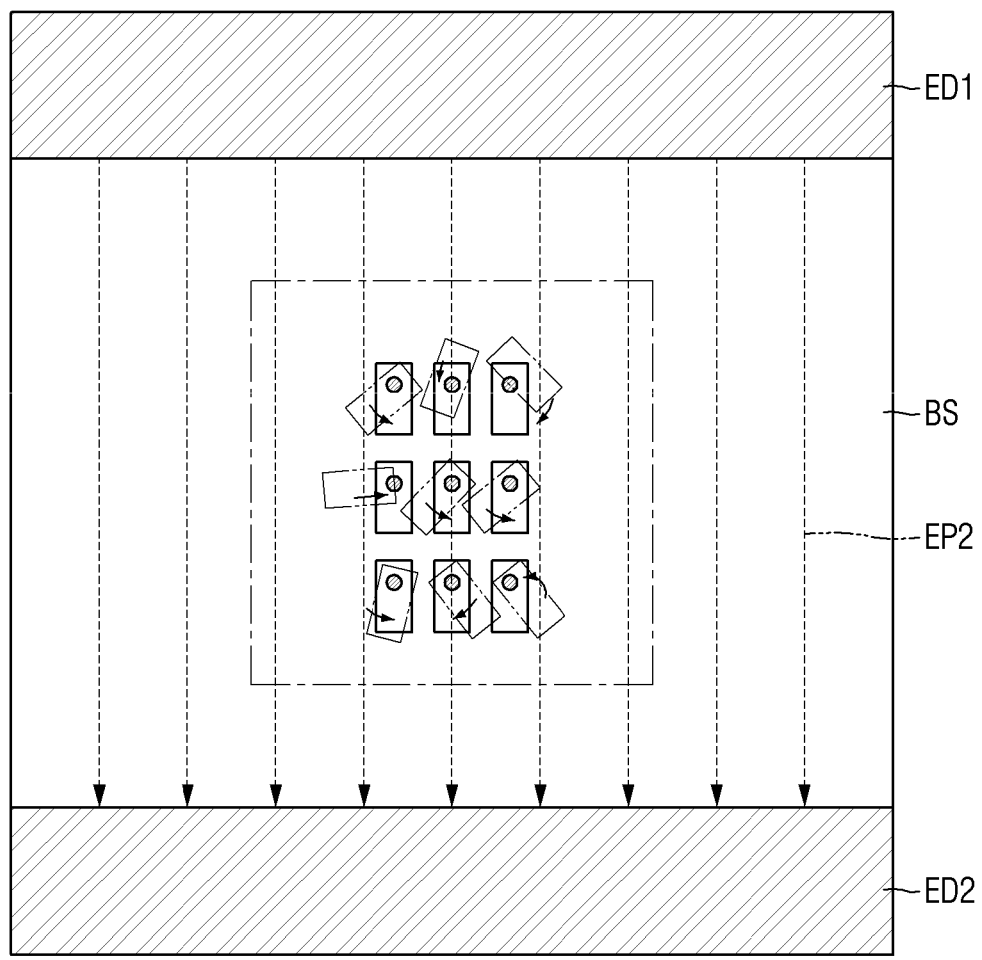
FIGS. 13-15 are schematic diagrams illustrating aspects of one operation of the method of aligning light-emitting elements according to an embodiment.
Figure 14:
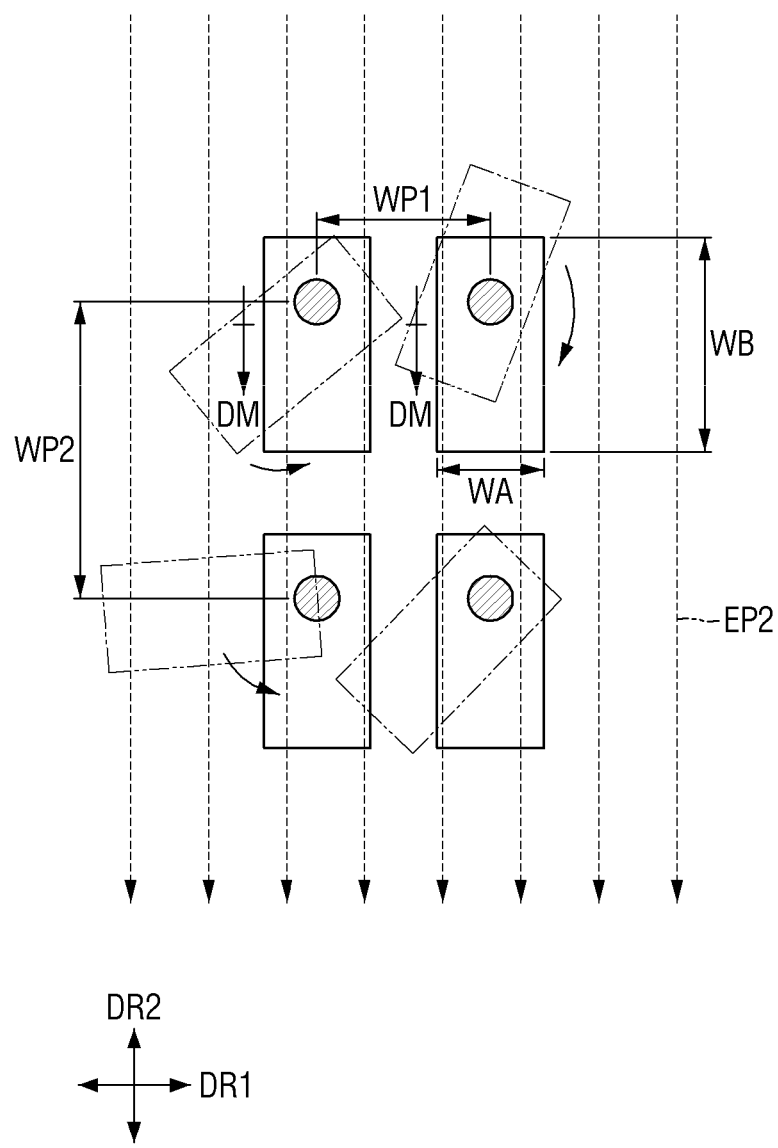
Figure 15:
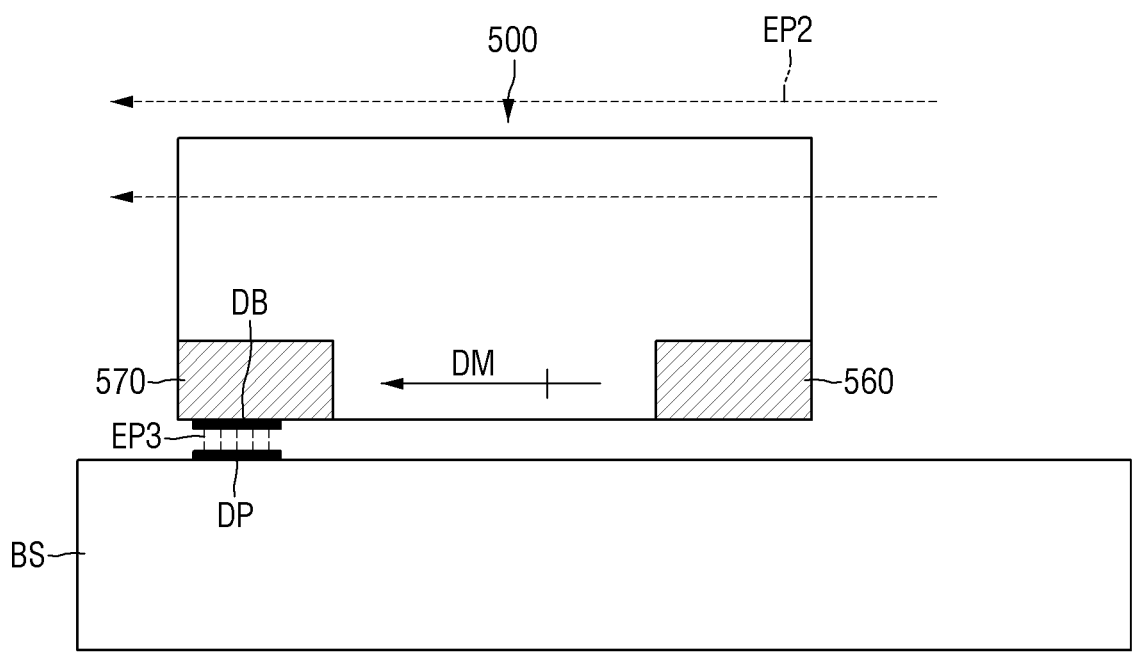

FIGS. 13 to 15 are schematic diagrams illustrating one operation of the method of aligning light-emitting elements according to an embodiment.

Referring to FIGS. 13 to 15, when at least some of the light-emitting elements 500 are seated on the conductive patterns DP, the light-emitting elements 500 may be oriented in one direction (S400). According to an embodiment, the orienting of the light-emitting elements 500 in one direction is an operation of determining an orientation of the plurality of light-emitting elements 500, and may include changing the directions of the long axes of the light-emitting elements 500 or the directions of one end of any of the light-emitting elements 500. As an example, the orienting of the light-emitting elements 500 in one direction may include applying a second alignment signal to the first alignment electrode ED1 and the second alignment electrode ED2 on the base substrate BS to form a second electromagnetic field EP2 on the base substrate BS, and thus change the directions of the long axes of the light-emitting elements 500.

For example, even when the light-emitting elements 500 are positioned on the conductive patterns DP, the directions of the long axes of the light-emitting elements 500 may be randomly oriented. Here, when the second electromagnetic field EP2 is formed on the base substrate BS in one direction, the light-emitting elements 500 may receive a dielectrophoretic force due to the second electromagnetic field EP2 and thus may vary (e.g., change) in orientation of the directions of the long axes.

For example, as shown in FIG. 13, the first alignment electrode ED1 and the second alignment electrode ED2 may be spaced apart from each other on the base substrate BS in the second direction DR2. The plurality of conductive patterns DP may be between the first alignment electrode ED1 and the second alignment electrode ED2, and the light-emitting elements 500 may be placed or seated on the conductive patterns DP. When a second alignment signal is applied to the first alignment electrode ED1 and the second alignment electrode ED2, a second electromagnetic field EP2 pointing in one direction may be generated above the base substrate BS, or between the first alignment electrode ED1 and the second alignment electrode ED2. In an example embodiment, an alternative voltage may be applied to the first alignment electrode ED1, and the second alignment electrode ED2 may be grounded. The second electromagnetic field EP2 may be generated in a direction from the first alignment electrode ED1 to the second alignment electrode ED2, for example, in the second direction DR2. The second electromagnetic field EP2 may be an electric field and/or a magnetic field generated due to the second alignment signal, but the present disclosure is not limited thereto.

The light-emitting element 500 may receive a dielectrophoretic force due to the second electromagnetic field, and thus may vary (e.g., change) in orientation. Similar to the second electromagnetic field EP2 pointing in one direction, the light-emitting elements 500 may also be oriented to point in the same direction. According to an embodiment, the light-emitting element 500 may have magnetism DM (see FIG. 14) formed in the same direction as the direction of the long axis. For example, the first electrode unit 560 and the second electrode unit 570 of each of the light-emitting elements 500 may be spaced apart from each other along the direction of the long axis, and the magnetism DM may be formed between the first electrode unit 560 and the second electrode unit 570. As an example, the lower substrate 501 of the light-emitting element 500 may contain a material including a magnetic substance, and magnetism such as ferromagnetism and/or paramagnetism may be assigned to the lower substrate 501. Thus, magnetism DM pointing in the long axis direction, or in a direction in which the first electrode unit 560 and the second electrode unit 570 are spaced apart from each other, may be formed. In some embodiments, the light-emitting element 500 may receive a dielectrophoretic force such that the direction of the long axis is (e.g., becomes) the same as the direction of the second electromagnetic field EP2. For example, according to an embodiment, the determining of the orientation of the light-emitting elements 500 in the method of aligning the light-emitting elements 500 may include orienting the light-emitting elements 500 such that the directions of the long axes and the direction of the second electromagnetic field EP2 are the same as each other.

As shown in FIG. 15, magnetism DM pointing in one direction may be formed between the first electrode unit 560, or the first electrode layer 561, and the second electrode unit 570, or the second electrode layer 571. Such a dipole moment may be formed by doping the first electrode layer 561 and the second electrode layer 571 of the light-emitting element 500 with different conductive type (e.g., p-type or n-type) impurities. However, the present disclosure is not limited thereto. Accordingly, the method of forming a dipole moment is not particularly limited as long as the first electrode unit 560 and the second electrode unit 570 contain a conductive material and a dipole moment can be formed therebetween.

As an example, magnetism DM pointing in a direction from the first electrode unit 560 to the second electrode unit 570, which is the same as the long axis direction, may be formed in the light-emitting element 500. In this case, the light-emitting element 500 may receive a dielectrophoretic force such that the direction of the magnetism DM is (becomes) the same as the direction of the second electromagnetic field EP2. The light-emitting elements 500, each of which has a shape extending in one direction, may be mutually aligned on the conductive patterns DP by varying (e.g., changing) their respective positions and orientations due to the dielectrophoretic force.

In some embodiments, when an alignment signal is applied to the conductive patterns DP, and the conductive balls DB are seated on the conductive patterns DP, the light-emitting elements 500 may be rotated such that only the orientations are changed while the positions are maintained. To this end, according to an embodiment, the determining of the orientation of the light-emitting elements 500 may include applying a third alignment signal to the conductive patterns DP, and transferring an attractive force to the conductive balls DB by a third electromagnetic field EP3 (see FIG. 15) generated due to the third alignment signal. The third alignment signal may have greater strength than the first alignment signal, and the third electromagnetic field EP3 may transfer a stronger attractive force than the first electromagnetic field EP1. Thus, when the conductive balls DB are seated on the conductive patterns DP, the light-emitting elements 500 may vary (e.g., change) in orientation only, due to the second electromagnetic field EP2, while the positions of the conductive balls DB are not changed. As shown in FIG. 14, some light-emitting elements 500 may have conductive balls DB that do not need to vary (e.g., change) in position, and these light-emitting elements 500 may rotate around the conductive balls so that only the orientations of the light-emitting elements 500 can vary (e.g. change). In some embodiments, the light-emitting elements 500 may be oriented such that the second direction DR2, which is the direction in which the second electromagnetic field EP2 is applied, is the same as the direction of the magnetism DM while the light-emitting elements 500 are seated on the conductive patterns DP.

In some embodiments, some of the light-emitting elements 500 may have conductive balls DB that are not seated on the conductive patterns DP, but are partially positioned on the conductive patterns DP, or positioned in spaces between the conductive patterns DP. The light-emitting elements 500 partially positioned on the conductive patterns DP may receive a strong attractive force due to the third electromagnetic field EP3 formed on the conductive patterns DP, and then may move so that the conductive balls DB are seated on the conductive patterns DP. At the same time (or concurrently), the light-emitting elements 500 may receive a dielectrophoretic force due to the second electromagnetic field EP2, and thus some of the light-emitting elements 500 may be oriented while seated on the conductive patterns DP.

Despite receiving an attractive force due to the third electromagnetic field EP3, some light-emitting elements 500 may be positioned in the spaces between the conductive patterns DP, and thus may have conductive balls DB that are not seated on the conductive patterns DP. In this case, the orientations of these light-emitting elements 500 may vary (e.g., change) while their positions continuously (or concurrently) vary (e.g., change) due to the second electromagnetic field EP2. According to an embodiment, by adjusting the distance between the conductive patterns DP to be regular (e.g., substantially regular), it is possible to prevent or reduce the risk of the light-emitting elements 500 varying (e.g. changing) only in orientation, while not being seated on the conductive patterns DP.

According to an embodiment, the distances between the conductive patterns DP may include distances WP1 and WP2 at which the conductive patterns DP are spaced from one another in one direction, respectively. The first distance WP1 in a direction crossing (e.g., perpendicular to) the direction of the second electromagnetic field EP2 may be shorter than the length WB of the long axes of the light-emitting elements 500. For example, the conductive patterns DP may be spaced apart from one another in the first direction DR1 and the second direction DR2. Some of the conductive patterns DP may be spaced apart from one another at (by) first distances WP1 in the first direction DR1, and other conductive patterns DP may be spaced apart from one another at (by) second distances WP2 in the second direction DR2. As described above, when the second electromagnetic field EP2 is generated in the second direction DR2, the first distance WP1, at which the conductive patterns DP are spaced apart from one another in the first direction DR1, may be shorter than the length WB of the long axes of the light-emitting elements 500.

When any light-emitting element 500 receives a dielectrophoretic force due to the second electromagnetic field EP2 while the conductive ball DB of the light-emitting element 500 is seated on a conductive pattern DP, the light-emitting element 500 may rotate around the conductive pattern DP so that the orientation of the light-emitting element 500 changes. Here, another light-emitting element 500 positioned between one conductive pattern DP and another conductive pattern DP spaced from the one conductive pattern DP in the first direction DR1 may be brought into physical contact with the rotating light-emitting element 500, and thus the position and orientation of the other light-emitting element 500 may vary (e.g., change). For example, the light-emitting element 500 positioned between the conductive patterns DP may collide with other light-emitting elements 500, so that the position and orientation of the light-emitting element 500 between the conductive patterns may change, and thus the light-emitting element 500 may move into an area affected by the third electromagnetic field EP3 generated on the conductive patterns DP. In this case, the conductive ball DB of the corresponding light-emitting element 500 may receive an attractive force due to the third electromagnetic field EP3 generated on the corresponding conductive patterns DP. Accordingly, the conductive ball DB of the light-emitting element 500 may be seated on the corresponding conductive pattern DP.

When the distance between the conductive patterns DP is too large, there may be light-emitting elements 500 that are not in physical contact with light-emitting elements 500 rotating around the conductive patterns DP. In this case, the light-emitting elements 500 may remain placed on no conductive patterns DP (e.g., may remain between the conductive patterns DP). To prevent or reduce the risk of this case, the distance between the conductive patterns DP may be adjusted according to the length WB of the long axes of the light-emitting elements 500, the diameter (or width) WA of the short axes of the light-emitting elements 500, and/or the like.

In an example embodiment, the first distance WP1, at which the conductive patterns DP are spaced apart from one another in the first direction DR1, may be greater than the diameter (or width) WA of the short axes of the light-emitting elements 500 and may be less than two times the diameter (or width) WA of the short axes. In some embodiments, the second distance WP2, at which the conductive patterns DP are spaced apart from one another in the second direction DR2, may be greater than the length WB of the long axes of the light-emitting elements 500 and may be less than two times the length WB of the long axes.

As described above, magnetism DM may be formed in the same direction as that of the long axes of the light-emitting elements 500, and thus the light-emitting elements 500 may be oriented in the direction of the second electromagnetic field EP2. In one light-emitting element 500, the length WB of the long axis pointing in the same direction as that of the second electromagnetic field EP2, and the diameter (or width) WA of the short axis perpendicular to the long axis, may be defined. The plurality of conductive patterns DP may be spaced apart from one another at (by) the second distances WP2 in the second direction DR2, which is the direction of the second electromagnetic field EP2, and may be spaced apart from one another at (by) the first distances WP1 in the first direction DR1, which crosses (e.g., is perpendicular to) the direction of the second electromagnetic field EP2. The first distance WP1 and the second distance WP2 between the conductive patterns DP may be adjusted to be within the above-described ranges, according to the diameter (or width) WA of the short axes and the length WB of the long axes of the light-emitting elements 500, respectively. Accordingly, when the light-emitting elements 500 having the conductive balls DB seated on the conductive patterns DP are oriented, the light-emitting elements 500 positioned between the conductive patterns DP may also vary (e.g., change) in position and orientation due to the physical contact with the seated light-emitting elements 500, and thus may also be seated on the conductive patterns DP. Therefore, one light-emitting element 500 may be on each conductive pattern DP, and a plurality of light-emitting elements 500 may be aligned such that orientations, that is, the directions of the long axes, of the light-emitting elements 500 are uniform (e.g., substantially uniform).

Figure 16:
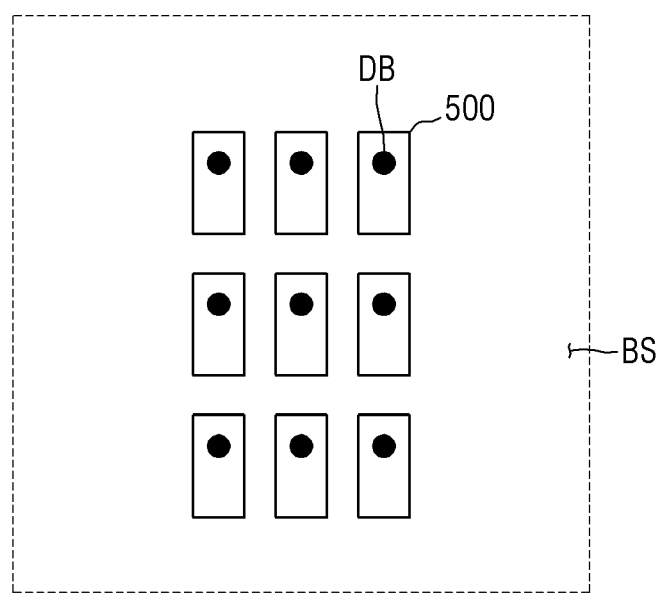
FIG. 16 is a plan view illustrating a base substrate on which light-emitting elements are aligned according to an embodiment.

FIG. 16 is a plan view illustrating a base substrate on which light-emitting elements are aligned according to an embodiment.

Referring to FIG. 16, a plurality of light-emitting elements 500 on a base substrate BS may be spaced apart from one another at uniform (e.g., substantially uniform) distances, and may be aligned such that the orientations of the long axes of the light-emitting elements 500 are the same direction. As described above, the method of aligning the light-emitting elements 500 according to an embodiment may include aligning (e.g., positioning) the light-emitting elements 500 on conductive patterns DP on the base substrate BS using the conductive balls DB of the light-emitting elements 500 and the conductive patterns DP, and determining (e.g., changing) the orientations of the light-emitting elements 500.

Thus, the plurality of light-emitting elements 500 may be uniformly (e.g., substantially uniformly) spaced apart from one another according to the conductive patterns DP, and the orientations of the long axes may be uniformly (e.g., substantially uniformly) aligned. Like the conductive patterns DP, the light-emitting elements 500 may be spaced apart from one another and oriented in the first direction DR1 and the second direction DR2. The conductive patterns DP may be spaced apart from one another at (by) the first distances WP1 and the second distances WP2, and the first distance WP1 and the second distance WP2 may be in a set or specific relationship with the diameter (or width) WA and the length WB of the long axes of the light-emitting elements 500. Similarly, the distances between the light-emitting elements 500 in the first direction DR1 and the second direction DR2 may be in a set or specific relationship with the diameter (or width) WA and the length WB of the long axes of the light-emitting elements 500. As an example, the distances between the light-emitting elements 500 in the first direction DR1 may each be shorter than the length WB of the long axes of the light-emitting elements 500. Also, the distances between the light-emitting elements 500 in the second direction DR2 may each be shorter than the length of the long axes of the light-emitting elements 500. However, the present disclosure is not limited thereto.

Subsequently, by removing the ink Ink sprayed onto the base substrate BS, the light-emitting elements 500 may be aligned on the base substrate BS. The method of removing the ink Ink may include a drying process using heat treatment, a drying process using light radiation, and/or the like and is not particularly limited.

As described above, a display device 10 including the plurality of light-emitting elements 500 may be fabricated through a process of transferring the light-emitting elements 500 aligned on the base substrate BS onto the target substrate SUB. As shown in FIGS. 4 and 16, the light-emitting elements 500 may be aligned on the base substrate BS, and areas corresponding to pixels PX and sub-pixels PXn of the display device 10 may be defined on a target substrate SUB. The display device 10 may be fabricated by transferring the light-emitting elements 500 from the base substrate BS to the target substrate SUB using the transfer device TD (see FIG. 4). The display device 10 fabricated through the above-described method will be described below with further reference to other drawings.

Figure 17:
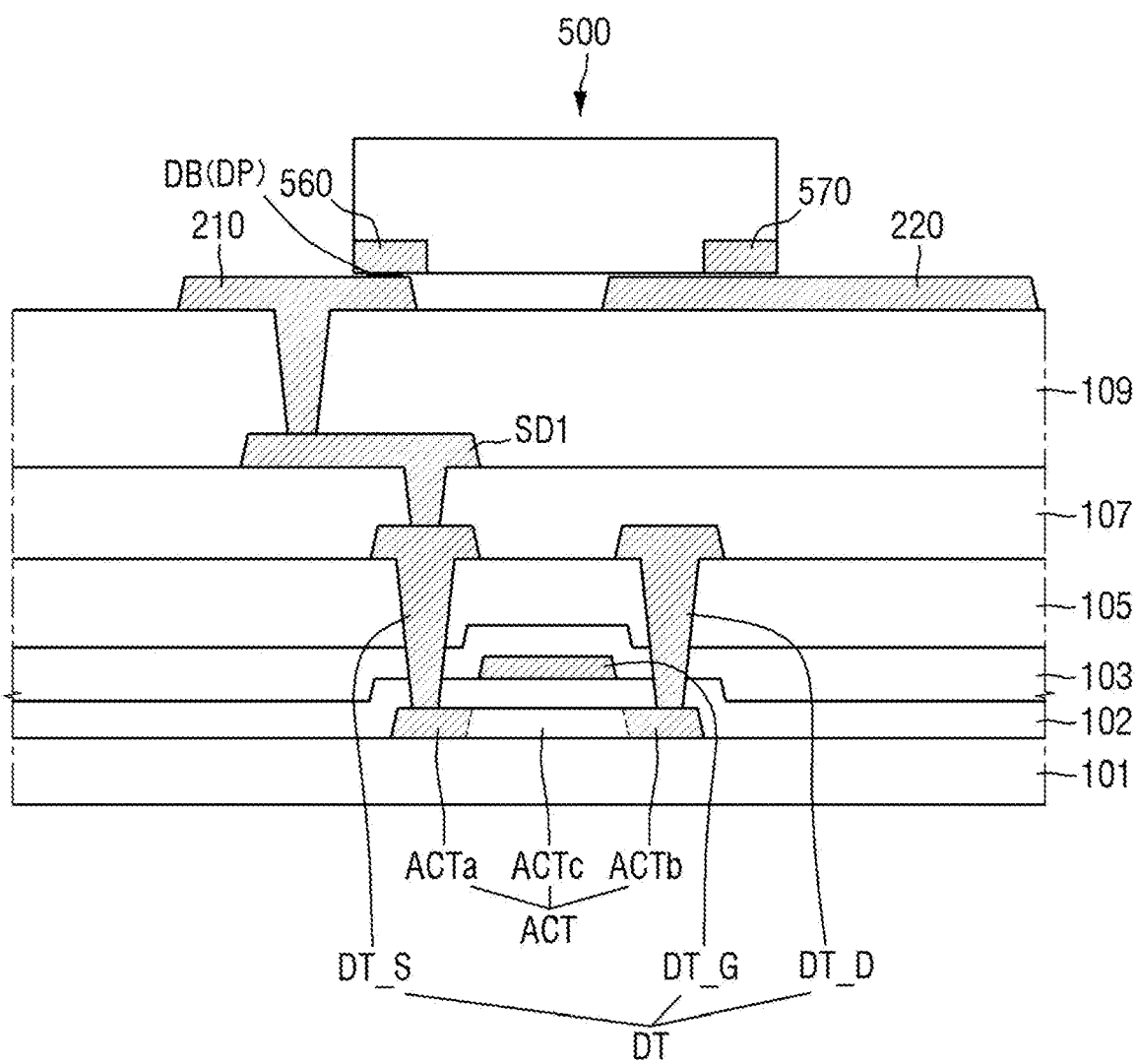
FIG. 17 is a cross-sectional view illustrating one sub-pixel of a display device according to an embodiment.

FIG. 17 is a cross-sectional view illustrating one sub-pixel of a display device according to an embodiment.

Referring to FIG. 17, a display device 10 may include a first substrate 101, a plurality of semiconductor layers, a plurality of conductive layers, a plurality of insulating layers, and a light-emitting element 500 on the first substrate 101. The plurality of semiconductor layers and the plurality of conductive layers may form circuit elements of each sub-pixel PXn, and another conductive layer and the light-emitting element 500 may form a light-emitting diode EL of each sub-pixel PXn. In FIG. 17, only the light-emitting element 500 and a drive transistor DT are shown as being above the first substrate 101, but the present disclosure is not limited thereto. The display device 10 may further include additional members, for example, a scan transistor SCT, a sensing transistor SST, and/or the like. Also, for convenience of description, the light-emitting element 500 is schematically shown in FIG. 17. However, only the drive transistor DT shown as being on the first substrate 101 will be described in more detail below.

The first substrate 101 may be an insulating substrate. The first substrate 101 may be made of an insulating material such as glass, quartz, and/or a polymer resin. Also, the first substrate 101 may be a rigid substrate and may also be a flexible substrate which is bendable, foldable, and/or rollable.

In some embodiments, a light-blocking layer and a buffer layer may be further provided on the first substrate 101. The light-blocking layer may be formed of an opaque metal material that blocks or reduces light transmission, thereby preventing or reducing light from being incident onto an active material layer ACT of the drive transistor DT.

Also, the buffer layer may be arranged over the entirety of the first substrate 101, in addition to the light-blocking layer. The buffer layer may perform a surface planarization function while protecting the transistors DT of the pixels PX from moisture penetrating through the first substrate 101 that is vulnerable to moisture permeation. The buffer layer may include a plurality of inorganic layers that are alternately stacked. For example, the buffer layer may include multiple layers in which one or more inorganic layers, each of which including one selected from a silicon oxide layer SiOx, a silicon nitride layer SiNx, and a silicon oxynitride SiON, are alternately stacked.

The active material layer ACT of the drive transistor DT may be provided on the first substrate 101 or the buffer layer. In an example embodiment, the active material layer ACT may contain polycrystalline silicon, monocrystalline silicon, an oxide semiconductor, and/or the like. Polycrystalline silicon may be formed by crystallizing amorphous silicon. Examples of such crystallization method may include a rapid thermal annealing (RTA) method, a solid phase crystallization (SPC) method, an excimer laser annealing (ELA) method, a metal-induced crystallization (MILC) method, and a sequential lateral solidification (SLS) method, but the present disclosure is not limited thereto. When the active material layer ACT contains polycrystalline silicon, the active material layer ACT may include a first doped area ACTa, a second doped area ACTb, and a first channel area ACTc. The first channel area ACTc may be between the first doped area ACTa and the second doped area ACTb. The first doped area ACTa and the second doped area ACTb may be areas obtained by doping some areas of the active material layer ACT with impurities.

In an example embodiment, the active material layer ACT may contain an oxide semiconductor. In this case, each of the doped areas of the active material layer ACT may be a conductive area. The oxide semiconductor may be an oxide semiconductor containing indium (In). In some embodiments, the oxide semiconductor may be an indium tin oxide (ITO), an indium zinc oxide (IZO), an indium gallium oxide (IGO), an indium-zinc-tin oxide (IZTO), indium-gallium-tin oxide (IGTO), an indium-gallium-zinc-tin oxide (IGZTO), and/or the like. However, the present disclosure is not limited thereto.

A first gate insulating layer 102 is on the semiconductor layer (e.g., on the active material layer ACT) and the buffer layer. The first gate insulating layer 102 may include a semiconductor layer and may be on the first substrate 101 or the buffer layer. The first gate insulating layer 102 may function as a gate insulating layer of the drive transistor DT. The first gate insulating layer 102 may be formed of an inorganic material, for example, a silicon oxide ($SiO_x$) or a silicon nitride ($SiN_x$), or may be formed of a stacked structure thereof.

A first gate conductive layer is on the first gate insulating layer 102. The first gate conductive layer may include a first gate electrode DT_G of the drive transistor DT. The first gate electrode DT_G may overlap at least a partial area of the active material layer ACT. For example, the first gate electrode DT_G may overlap the first channel area ACTc of the active material layer ACT in a thickness direction.

The first gate conductive layer may include a single layer or multiple layers made of any one of molybdenum (Mo), aluminum (Al), chrome (Cr), gold (Au), titanium (Ti), nickel (Ni), neodymium (Nd), copper (Cu), or an alloy thereof. However, the present disclosure is not limited thereto.

A first protective layer 103 is on the first gate conductive layer. The first protective layer 103 may cover and protect the first gate conductive layer. The first protective layer 103 may be formed of an inorganic material, for example, a silicon oxide ($SiO_x$) or a silicon nitride ($SiN_x$), or may be formed of a stacked structure thereof.

A first interlayer insulating layer 105 is on the first protective layer 103. The first interlayer insulating layer 105 may function as an insulating film between the first protective layer 103 and other layers on the first interlayer insulating layer 105. The first interlayer insulating layer 105 may be formed of an inorganic material, for example, a silicon oxide ($SiO_x$) or a silicon nitride ($SiN_x$), or may be formed of a stacked structure thereof.

A first data conductive layer is on the first interlayer insulating layer 105. The first data conductive layer may include a first source/drain electrode DT_S and a second source/drain electrode DT_D of the drive transistor DT.

The first source/drain electrode DT_S and the second source/drain electrode DT_D of the drive transistor DT may be brought into contact (e.g., physical contact) with the first doped area ACTa and the second doped area ACTb of the active material layer ACT, respectively, through a contact hole passing through the first interlayer insulating layer 105, the first protective layer 103, and the first gate insulating layer 102. In some embodiments, the first source/drain electrode DT_S of the drive transistor DT may be electrically coupled to the light-blocking layer through another contact hole. When any one of the first source/drain electrode DT_S and the second source/drain electrode DT_D of the drive transistor DT is a source electrode, the other one may be a drain electrode. However, the present disclosure is not limited thereto. When any one of the first source/drain electrode DT_S and the second source/drain electrode DT_D is a drain electrode, the other one may be a source electrode.

The first data conductive layer may include a single layer or multiple layers made of any one of molybdenum (Mo), aluminum (Al), chrome (Cr), gold (Au), titanium (Ti), nickel (Ni), neodymium (Nd), copper (Cu), or an alloy thereof. However, the present disclosure is not limited thereto.

A second interlayer insulating layer 107 may be on the first data conductive layer. The second interlayer insulating layer 107 may be provided over the entirety of the first interlayer insulating layer 105 while covering the first data conductive layer, and may function to protect the first data conductive layer. The second interlayer insulating layer 107 may be formed of an inorganic material, for example, a silicon oxide ($SiO_x$) or a silicon nitride ($SiN_x$), or may be formed of a stacked structure thereof.

A second data conductive layer is on the second interlayer insulating layer 107. The second data conductive layer may include a first conductive line SD1. In some embodiments, a first voltage line VSSL for applying a low-level voltage (first power voltage) VSS to be supplied to a common electrode 220, which will be described below in more detail, and a second voltage line VDDL for applying a high-level voltage (second power voltage) VDD to be supplied to the drive transistor DT may be further provided on the second data conductive layer.

The first conductive line SD1 may be electrically coupled to the first source/drain electrode DT_S of the drive transistor DT through the contact hole formed on the second interlayer insulating layer 107. The first conductive line SD1 may be brought into contact with a pixel electrode 210, which will be described below in more detail, and the drive transistor DT may transfer the second power voltage VDD applied from the second voltage line VDDL to the pixel electrode 210 through the first conductive line SD1.

The second data conductive layer may include a single layer or multiple layers made of any one of molybdenum (Mo), aluminum (Al), chrome (Cr), gold (Au), titanium (Ti), nickel (Ni), neodymium (Nd), copper (Cu), or an alloy thereof. However, the present disclosure is not limited thereto.

A first planarization layer 109 is on the second data conductive layer. The first planarization layer 109 may contain an organic insulating material and may perform a surface planarization function.

A first electrode and a second electrode are on the first planarization layer 109. The first electrode may be the pixel electrode 210, and the second electrode may be the common electrode 220. The pixel electrode 210 and the common electrode 220 may be spaced apart from each other. The pixel electrode 210 may be brought into contact with the first conductive line SD1 by passing through a contact hole in the first planarization layer 109 for exposing the first conductive line SD1. In some embodiments, the common electrode 220 may be brought into contact with the first voltage line VSSL through the contact hole passing through the first planarization layer 109. Thus, the first power voltage VSS may be applied to the common electrode 220, and the second power voltage VDD may be applied to the pixel electrode 210 through the drive transistor DT and the first conductive line SD1. In an example embodiment, the pixel electrode 210 may be separately provided to each sub-pixel PXn, and the common electrode 220 may be an electrode coupled in common to the sub-pixels PXn. The pixel electrode 210 may be an anode electrode of the light-emitting diode EL, and the common electrode 220 may be a cathode electrode of the light-emitting diode EL. However, the present disclosure is not limited thereto, and the opposite is also a possible case.

A light-emitting element 500 may be on the pixel electrode 210 and the common electrode 220. For example, a first electrode unit 560 of the light-emitting element 500 may be on the pixel electrode 210, and a second electrode unit 570 of the light-emitting element 500 may be on the common electrode 220. According to an embodiment, the light-emitting element 500 may include a conductive ball DB on the first electrode unit 560 or the second electrode unit 570, and the conductive ball DB may be in contact (e.g., physical contact) with the pixel electrode 210 or the common electrode 220. In FIG. 17, it is shown that the conductive ball DB is on the first electrode unit 560 and the conductive ball DB is brought into contact with the pixel electrode 210. However, the present disclosure is not limited thereto. When the conductive ball DB is on the second electrode unit 570, the conductive ball DB may be brought into contact with the common electrode 220, and the first electrode layer 561 of the first electrode unit 560 may be brought into contact with the pixel electrode 210. Thus, the first electrode unit 560 of the light-emitting element 500 may be electrically coupled to the first electrode or the pixel electrode 210, and the second electrode unit 570 of the light-emitting element 500 may be electrically coupled to the second electrode or the common electrode 220.

The display device 10 may be fabricated through a process of transferring, onto a target substrate SUB, light-emitting elements 500 aligned using the method of aligning light-emitting elements 500 of the present embodiments. Here, in order to uniformly (e.g., substantially uniformly) align the light-emitting elements 500, conductive patterns DP and conductive balls DB may be used for the method of aligning light-emitting elements 500 according to an embodiment. The conductive balls DB of the light-emitting elements 500 may remain on the light-emitting elements 500 transferred onto the target substrate SUB. Also, according to an embodiment, a conductive pattern DP may be on at least one of the first electrode 210 or the second electrode 220. As an example, the conductive pattern DP may be formed through a process for metal deposition and patterning during a process (act) of forming the first electrode 210 and the second electrode 220. However, the present disclosure is not limited thereto.

When the conductive pattern DP is on the first electrode 210 or the second electrode 220, the light-emitting element 500 may be arranged such that the conductive balls DB correspond to the conductive patterns DP in the process during which the light-emitting element 500 is arranged. Thus, according to an embodiment, a plurality of light-emitting elements 500 may be uniformly (e.g., substantially uniformly) positioned between the first electrode 210 and the second electrode 220 using the method of aligning light-emitting elements 500 of the present embodiments. Also, as described above, the conductive ball DB and the conductive pattern DP contain conductive materials. Thus, even when a conductive ball DB is between the pixel electrode or the common electrode 220 and the electrode units 560 and 570 of the light-emitting element 500, the light-emitting element 500 may receive electric signals from the pixel electrode 210 and the common electrode 220.

A method of aligning light-emitting elements 500 according to another embodiment will be described below.

Figure 18:
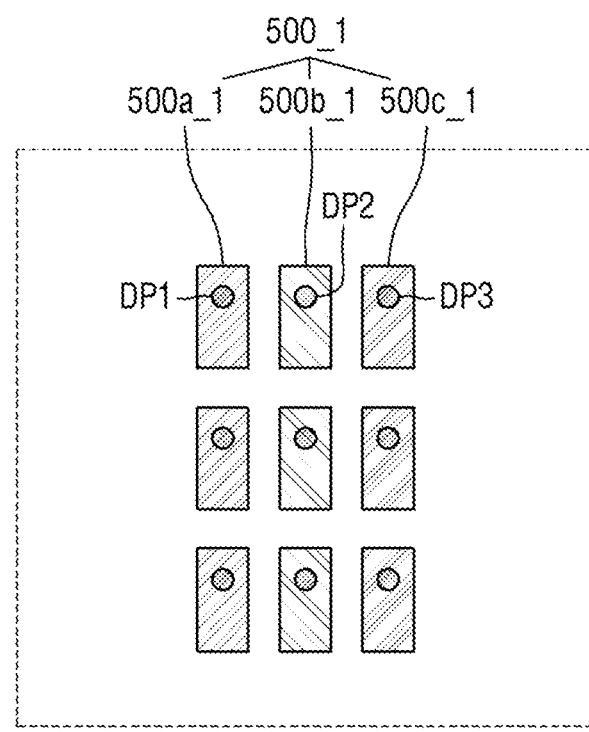
FIG. 18 is a plan view illustrating a base substrate on which light-emitting elements are aligned according to another embodiment.

FIG. 18 is a plan view illustrating a base substrate on which light-emitting elements are aligned according to another embodiment.

Referring to FIG. 18, a method of aligning light-emitting elements 500 according to an embodiment may include aligning different types (or kinds) of light-emitting elements 500a_1, 500b_1, and 500c_1 on the same base substrate BS. The present embodiment may be different from the embodiment of FIG. 4 in that the light-emitting elements 500_1 may be different and may be aligned separately. The following description will focus on the difference, and redundant descriptions of the same elements will not be provided.

In the embodiment of FIG. 18, the light-emitting elements 500_1 may include different light-emitting elements, for example, a first light-emitting element 500a_1, a second light-emitting element 500b_1, and a third light-emitting element 500c_1. The light-emitting elements 500_1 may emit different colors of light depending on the type (e.g., material) of an active layer 530. According to an embodiment, the first light-emitting element 500a_1 may emit a first color of light, the second light-emitting element 500b_1 may emit a second color of light, and the third light-emitting element 500c_1 may emit a third color of light. The first color may be blue, the second color may be green, and the third color may be red.

When the plurality of light-emitting elements 500_1 emit different colors of light, the display device 10 including the different light-emitting elements 500_1 requires the light-emitting elements 500_1 to be arranged on predetermined (or set) pixels PX or sub-pixels PXn. For example, when any pixel PX includes a first sub-pixel PX1 that displays a first color of light, a second sub-pixel PX2 that displays a second color of light, and a third sub-pixel PX3 that displays a third color of light, the first light-emitting element 500a_1, the second light-emitting element 500b_1, and the third light-emitting element 500c_1 need to be arranged on the first sub-pixel PX1, the second sub-pixel PX2, and the third sub-pixel PX3, respectively. Similarly, when different light-emitting elements 500_1 are aligned, certain light-emitting elements 500_1 need to be seated and aligned on the corresponding conductive patterns DP. In the method of aligning the light-emitting elements 500_1 according to an embodiment, conductive patterns DP on a base substrate BS may include different conductive patterns DP1, DP2, and DP3. In an operation of positioning or seating the light-emitting elements 500_1 on the conductive patterns DP, different light-emitting elements 500a_1, 500b_1, and 500c_1 may be positioned or seated on different conductive patterns DP1, DP2, and DP3.

Figure 19:
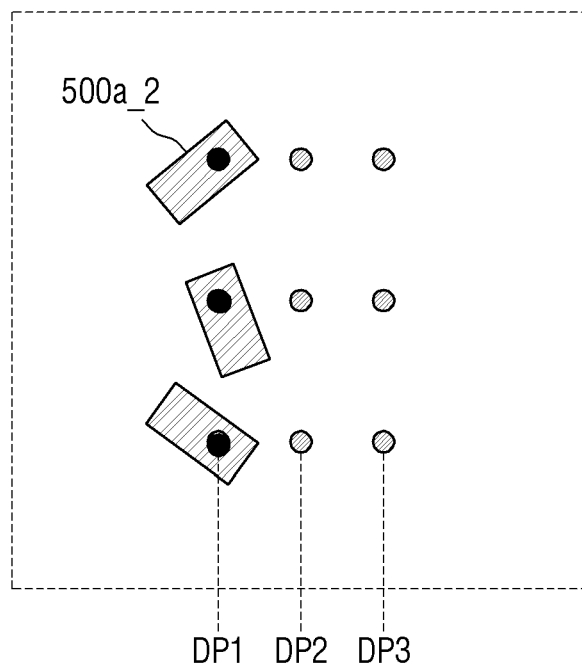
FIGS. 19-21 are schematic diagrams illustrating some operations of the method of aligning light-emitting elements according to another embodiment.
Figure 20:
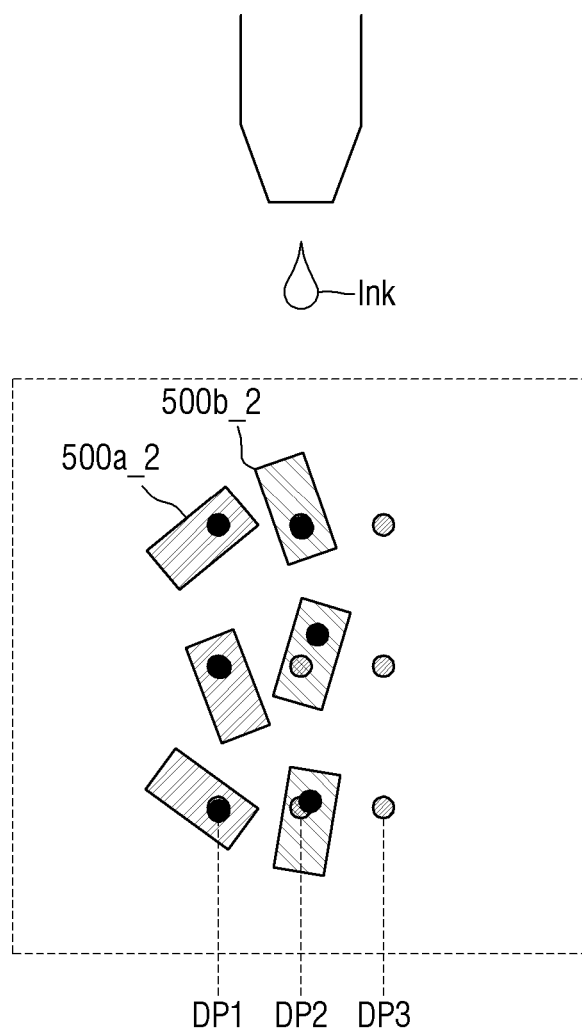
Figure 21:
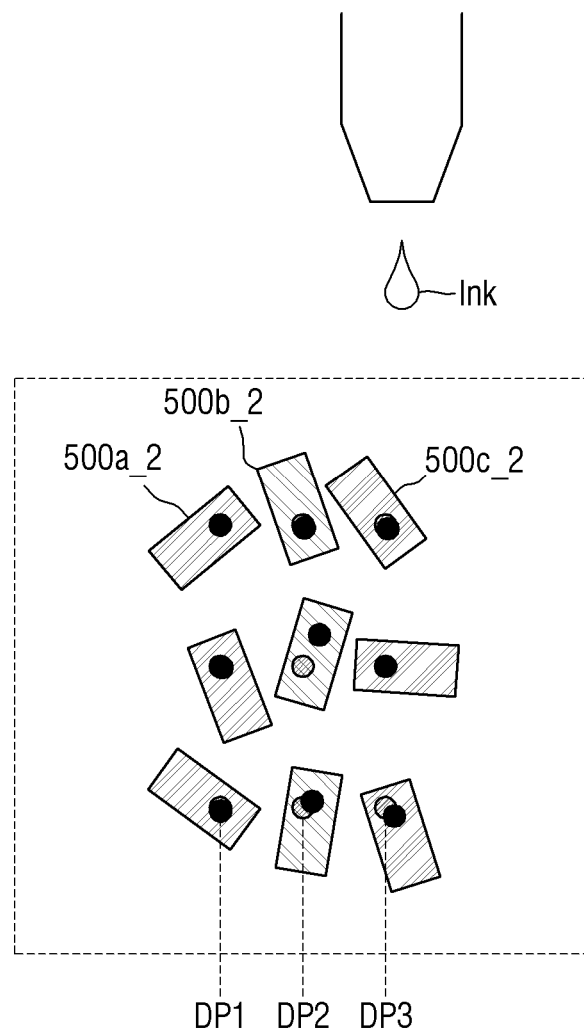

FIGS. 19 to 21 are schematic diagrams illustrating some operations of the method of aligning light-emitting elements according to another embodiment.

Referring to FIGS. 19 to 21, the base substrate BS may include a plurality of conductive patterns DP1, DP2, and DP3 to which a first alignment signal may be individually applied. A plurality of first conductive patterns DP1, a plurality of second conductive patterns DP2, and a plurality of third conductive patterns DP3 may be spaced apart from one another in the second direction DR2 (e.g., a plurality of first conductive patterns DP1 may be spaced apart from one another in the second direction DR2, a plurality of second conductive patterns DP2 may be spaced apart from one another in the second direction DR2, and a plurality of third conductive patterns DP3 may be spaced apart from one another in the second direction DR2). The first conductive patterns DP1 and the second conductive patterns DP2 may be spaced apart from each other in the first direction DR1, and the second conductive patterns DP2 and the third conductive patterns DP3 may be spaced apart from each other in the first direction DR1. For example, the same conductive patterns among the conductive patterns DP1, DP2, and DP3 may be spaced apart from one another in the second direction DR2 to form a linear pattern on the base substrate BS. Different conductive patterns DP1, DP2, and DP3 may be spaced apart from one another in the first direction DR1 and may be alternately repeated.

The base substrate BS may have lines for applying the first alignment signal and the third alignment signal to the conductive patterns DP1, DP2, and DP3. Unlike the embodiment of FIG. 10, different conductive patterns, for example, the first conductive pattern DP1, the second conductive pattern DP2, and the third conductive pattern DP3 may be electrically coupled to different lines, and alignment signals may be individually applied to the conductive patterns. Thus, the method of aligning the light-emitting elements 500 according to an embodiment may include individually aligning different light-emitting elements 500.

For example, as shown in FIG. 19, ink Ink in which first light-emitting elements 500a_2 are dispersed is sprayed onto the base substrate BS, and the first alignment signal is applied only to the first conductive pattern DP1. Thus, the conductive balls DB of the first light-emitting elements 500a_2 sprayed onto the base substrate BS receive an attractive force from a first electromagnetic field EP1 generated by the first conductive pattern DP1, and thus the first light-emitting elements 500a_2 may be seated on the first conductive pattern DP1.

Subsequently, as shown in FIG. 20, ink Ink in which second light-emitting elements 500b_2 are dispersed is sprayed onto the base substrate BS, the first alignment signal is applied to the second conductive pattern DP2, and the third alignment signal is applied to the first conductive pattern DP1. Thus, the conductive balls DB of the second light-emitting elements 500b_2 may receive an attractive force from the first electromagnetic field EP1 generated on the second conductive pattern DP2, and thus the second light-emitting elements 500b_2 may be seated on the second conductive pattern DP2. Concurrently, the third alignment signal having greater strength than the first alignment signal is applied to the first conductive pattern DP1, and thus a third electromagnetic field EP3 having greater strength may be generated on the first conductive pattern DP1. Thus, even though the first electromagnetic field EP1 is generated in the second conductive pattern DP2, the first light-emitting elements 500a_2 seated on the first conductive pattern DP1 may remain seated on the first conductive pattern DP1 without changing their positions. Also, because an alignment signal is not applied to the third conductive pattern DP3, no light-emitting elements are positioned on the third conductive pattern DP3.

Subsequently, as shown in FIG. 21, ink Ink in which third light-emitting elements 500c_2 are dispersed is sprayed onto the base substrate BS, the first alignment signal is applied to the third conductive pattern DP3, and the third alignment signal is applied to the first conductive pattern DP1 and the second conductive pattern DP2. Thus, the first light-emitting elements 500a_2 may be seated or positioned on the first conductive pattern DP1, the second light-emitting elements 500b_2 may be seated or positioned on the second conductive pattern DP2, and the third light-emitting elements 500c_2 may be seated or positioned on the third conductive pattern DP3. The description thereof is the same as described above.

Subsequently, the second electromagnetic field EP2 may be generated using the alignment electrodes ED1 and ED2 provided on the base substrate BS, to align the directions of the first light-emitting element 500a_2, the second light-emitting element 500b_2, and the third light-emitting element 500c_2. According to an embodiment, different light-emitting elements may be aligned on desired positions using the conductive patterns DP1, DP2, and DP3 to which alignment signals may be individually applied.

In some embodiments, the conductive patterns DP on the base substrate BS may correspond to the shape of an area defined on the target substrate SUB onto which the light-emitting elements 500 are to be transferred. For example, when the light-emitting elements 500 are arranged on the target substrate SUB not in the first direction DR1 and the second direction DR2, but in an inclined direction, the conductive patterns DP on the base substrate BS may be arranged in a corresponding structure.

Figure 22:
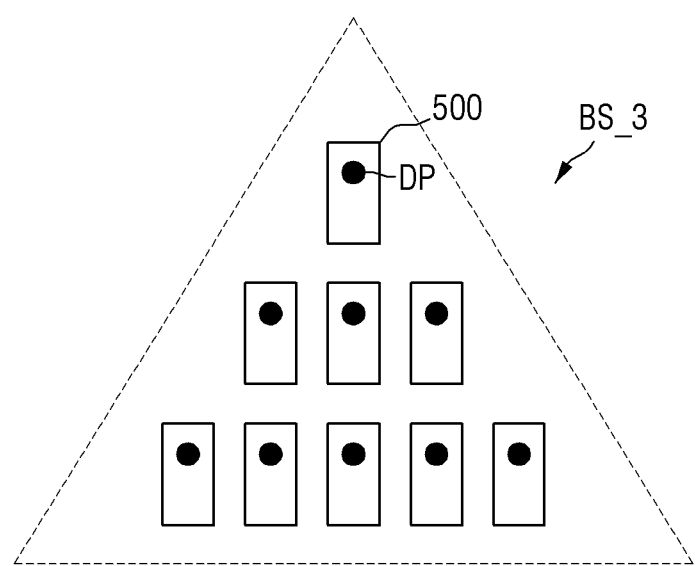
FIG. 22 is a plan view illustrating a base substrate on which light-emitting elements are aligned according to another embodiment.

FIG. 22 is a plan view illustrating a base substrate on which light-emitting elements are aligned according to another embodiment.

Referring to FIG. 22, according to an embodiment, conductive patterns DP of a base substrate BS_3 may not necessarily be arranged in the first direction and in the second direction perpendicular to the first direction. For example, a plurality of conductive patterns DP may be spaced apart from one another in one direction and another direction that crosses the one direction, but is not perpendicular to the one direction. Thus, the light-emitting elements 500 aligned on the conductive pattern DP may be aligned in one direction and another direction that is not perpendicular to, but crosses, the one direction. In this case, a display device 10 having the arrangement of pixels PX and sub-pixels PXn different from the arrangement of FIG. 2 may be fabricated using the method of aligning the light-emitting elements 500 according to an embodiment. Descriptions of the various elements are the same as provided above, and thus redundant descriptions thereof will not be provided.

The method of aligning light-emitting elements according to an embodiment may include positioning or seating the light-emitting elements on conductive patterns and then orienting the light-emitting elements in one direction. Thus, light-emitting elements may be formed on a substrate at uniform (e.g., substantially uniform) distances and oriented in a certain direction.

Also, according to an embodiment, a display device including a plurality of pixels may be fabricated using the method of aligning light-emitting elements, and in the display device, the light-emitting elements may be at accurate positions for each pixel.

As used herein, the terms "use," "using," and "used" may be considered synonymous with the terms "utilize," "utilizing," and "utilized," respectively.

In addition, the terms "substantially," "about," and similar terms are used as terms of approximation and not as terms of degree, and are intended to account for the inherent deviations in measured or calculated values that would be recognized by those of ordinary skill in the art.

Also, any numerical range recited herein is intended to include all subranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

In concluding the detailed description, those skilled in the art will appreciate that many variations and modifications can be made to the example embodiments without substantially departing from the principles of the present disclosure. Therefore, the disclosed embodiments are used in a generic and descriptive sense only and not for purposes of limitation.

What is claimed is:

1. A method of aligning light-emitting elements, the method comprising:
    providing a base substrate and a plurality of conductive patterns on the base substrate, the plurality of conductive patterns being spaced apart from one another;
    spraying ink in which a plurality of light-emitting elements are dispersed on the base substrate, and positioning the plurality of light-emitting elements on the plurality of conductive patterns; and
    orienting the plurality of light-emitting elements by orienting one end of each of the plurality of light-emitting elements in a first direction,
    wherein a light-emitting element of the plurality of light-emitting elements comprises a first electrode unit and a second electrode unit respectively at two ends of the light-emitting element, and a conductive ball on the first electrode unit and in direct contact with the first electrode unit,
    wherein the conductive ball is on a side of the light-emitting element other than the two ends of the light-emitting element, and adjacent to one of the two ends of the light emitting element, and
    wherein the second electrode unit is not in contact with any conductive balls.

2. The method of claim 1, wherein the positioning of the plurality of light-emitting elements comprises:
    applying a first alignment signal to the plurality of conductive patterns to generate a first electromagnetic field on the plurality of conductive patterns, and
    positioning at least a portion of the plurality of light-emitting elements on the plurality of conductive patterns.

3. The method of claim 2, wherein,
    an attractive force is to be applied by the first electromagnetic field to the conductive balls, and
    the positioning of the plurality of light-emitting elements comprises seating the conductive balls of the at least a portion of the plurality of light-emitting elements on the plurality of conductive patterns.

4. The method of claim 2, wherein,
    a first alignment electrode and a second alignment electrode are further arranged on the base substrate, the first alignment electrode and the second alignment electrode being spaced apart from each other in the first direction, and
    the orienting of the plurality of light-emitting elements comprises applying a second alignment signal to the first alignment electrode and the second alignment electrode to generate a second electromagnetic field on the base substrate, and to change positions and/or orientations of the plurality of light-emitting elements.

5. The method of claim 4, wherein the orienting of the plurality of light-emitting elements comprises applying a third alignment signal to the plurality of conductive patterns to generate a third electromagnetic field stronger than the first electromagnetic field.

6. The method of claim 4, wherein in the orienting of the plurality of light-emitting elements,
    one end of each of the plurality of light-emitting elements that are positioned on the plurality of conductive patterns is oriented in the first direction, and
    at least a portion of the plurality of light-emitting elements that are not positioned on the plurality of conductive patterns is placed on the plurality of conductive patterns and one end of each light-emitting element of the at least a portion of the plurality of light-emitting elements is oriented in the first direction.

7. The method of claim 1, wherein each light-emitting element of the plurality of light-emitting elements has a long axis extending in one direction and is to be oriented such that the long axis is in the first direction.

8. The method of claim 7, wherein a diameter of each of the plurality of light-emitting elements is larger than a diameter of each of the plurality of conductive patterns.

9. The method of claim 7, wherein,
the plurality of conductive patterns are spaced apart from each other in the first direction and in a second direction crossing the first direction,
a first distance is a distance between the plurality of conductive patterns spaced apart from each other in the first direction, and
the first distance is longer than a length of the long axis of each of the plurality of light-emitting elements.

10. The method of claim 9, wherein a second distance is a distance between the plurality of conductive patterns spaced apart from each other in the second direction, and
the second distance is shorter than the length of the long axis of each of the plurality of light-emitting elements and is longer than a diameter of each of the plurality of light-emitting elements.

11. The method of claim 7, wherein,
the plurality of light-emitting elements comprises a first semiconductor layer, a second semiconductor layer, and an active layer therebetween, and
the first semiconductor layer, the active layer, and the second semiconductor layer are stacked in another direction perpendicular to the one direction in which the plurality of light-emitting elements extend.

12. The method of claim 1, wherein the plurality of conductive patterns include a plurality of first conductive patterns spaced apart from each other in the first direction and a plurality of second conductive patterns spaced apart from each other in the first direction, and
wherein the plurality of second conductive patterns are spaced apart from the plurality of first conductive patterns in a second direction crossing the first direction.

13. The method of claim 12, wherein,
the plurality of light-emitting elements include a first light-emitting element and a second light-emitting element, and
in the positioning of the plurality of light-emitting elements,
a third electromagnetic field is generated on the plurality of first conductive patterns, and the first light-emitting element is positioned on the plurality of first conductive patterns, and
a first electromagnetic field is generated on the plurality of second conductive patterns, and the second light-emitting element is positioned on the plurality of second conductive patterns.

14. A method of fabricating a display device, the method comprising:
providing a base substrate and a plurality of conductive patterns on the base substrate, the plurality of conductive patterns being spaced apart from each other;
spraying ink in which a plurality of light-emitting elements are dispersed on the base substrate, each of the plurality of light-emitting elements having a shape extending in one direction, and comprising:
a first electrode unit and a second electrode unit respectively at two ends of each of the plurality of light-emitting elements, and
a conductive ball on the first electrode unit and in direct contact with the first electrode unit,
wherein the conductive ball is on a side of the light-emitting element other than the two ends of the light-emitting element, and adjacent to one of the two ends of the light emitting element, and
wherein the second electrode unit is not in contact with any conductive balls,
generating a first electromagnetic field on the plurality of conductive patterns, and positioning the plurality of light-emitting elements on the plurality of conductive patterns;
generating a second electromagnetic field on the base substrate in a first direction and orienting the plurality of light-emitting elements; and
transferring the plurality of light-emitting elements on a substrate.

15. The method of claim 14, wherein,
an attractive force is to be applied by the first electromagnetic field to the conductive balls, and
the positioning of the plurality of light-emitting elements comprises seating the conductive balls on the plurality of conductive patterns.

16. The method of claim 15, wherein the orienting of the plurality of light-emitting elements comprises rotating the plurality of light-emitting elements by the second electromagnetic field such that the one direction in which each of the plurality of light-emitting elements extends is substantially parallel to the first direction.

17. The method of claim 14, wherein,
the plurality of light-emitting elements are spaced apart from each other in the first direction and a second direction crossing the first direction, and
a length of each of the plurality of light-emitting elements in the one direction is longer than a distance in the second direction between adjacent ones of the plurality of light-emitting elements.

18. The method of claim 17, wherein a distance in the first direction between adjacent ones of the plurality of light-emitting elements is shorter than a length of a long axis of each of the plurality of light-emitting elements.

19. A display device comprising:
a first substrate;
a semiconductor layer on the first substrate, the semiconductor layer comprising an active material layer of a drive transistor;
a gate insulating layer on the semiconductor layer;
a first gate conductive layer on the gate insulating layer, the first gate conductive layer comprising a gate electrode of the drive transistor;
a first interlayer insulating layer on the first gate conductive layer;
a first data conductive layer on the first interlayer insulating layer, the first data conductive layer comprising a source/drain electrode of the drive transistor;
a second interlayer insulating layer on the first data conductive layer;
a second data conductive layer on the second interlayer insulating layer, the second data conductive layer comprising a first conductive line in contact with the source/drain electrode of the drive transistor;
a first planarization layer on the second data conductive layer;
a first electrode and a second electrode on the first planarization layer and spaced apart from each other; and
a light-emitting element, both end portions of which are on the first electrode and second electrode,
wherein the light-emitting element has a shape extending in one direction, comprises a first electrode unit and a second electrode unit respectively at two ends of the light-emitting element in the one direction, and further comprises a conductive ball on the first electrode unit and in direct contact with the first electrode unit, wherein the conductive ball is on a side of the light-emitting element other than the two ends of the light-emitting element, and adjacent to one of the two ends of the light emitting element, and wherein the second electrode unit is not in contact with any conductive balls.

20. The display device of claim 19, wherein, the light-emitting element comprises a first semiconductor layer, a second semiconductor layer, and an active layer therebetween, and the first semiconductor layer, the active layer, and the second semiconductor layer are stacked in another direction perpendicular to the one direction.

* * * * *